United States Patent [19]

Appels et al.

[11] 4,292,642

[45] Sep. 29, 1981

[54] SEMICONDUCTOR DEVICE

[75] Inventors: Johannes A. Appels; Marnix G. Collet; Paul A. H. Hart; Johannes F. C. M. Verhoeven, all of Eindhoven, Netherlands

[73] Assignee: U.S. Philips Corporation, New York, N.Y.

[21] Appl. No.: 4,004

[22] Filed: Jan. 16, 1979

[30] Foreign Application Priority Data

Jan. 18, 1978 [NL] Netherlands .......................... 7800582
Jul. 24, 1978 [NL] Netherlands .......................... 7807835

[51] Int. Cl.³ .......................................... H01L 29/90
[52] U.S. Cl. ........................................ 357/13; 357/22; 357/48; 357/52
[58] Field of Search ................... 357/13, 48, 52, 22

[56] References Cited

U.S. PATENT DOCUMENTS

| | | | |
|---|---|---|---|
| 3,586,931 | 6/1971 | Nienhuis | 357/22 |
| 3,999,207 | 12/1976 | Arai | 357/22 |
| 4,017,882 | 4/1977 | Kannom | 357/13 |
| 4,132,996 | 1/1979 | Babga | 357/22 X |
| 4,233,617 | 11/1980 | Klassen | 357/13 X |

FOREIGN PATENT DOCUMENTS 1073560  6/1967  United Kingdom .

*Primary Examiner*—Martin H. Edlow
*Attorney, Agent, or Firm*—Thomas A. Briody; Robert T. Mayer; James J. Cannon, Jr.

[57] ABSTRACT

Semiconductor devices, one having a planar bipolar high-voltage semiconductor circuit element comprising an island-shaped region of one conductivity type. On its lower side the island-shaped region is bounded by a first pn junction having a comparatively high breakdown voltage, and laterally by a second pn junction having a comparatively low breakdown voltage. The doping and the thickness of the island-shaped region are so small that the region is entirely depleted before breakdown occurs.

The second semiconductor device having a field effect transistor of the lateral or vertical type with an island-shaped region having a contact region and bounded at the bottom by a pn junction having a comparatively high breakdown voltage and laterally by a second pn junction having a comparatively low breakdown voltage. The doping and thickness of the island-shaped region are so small that the region situated between the second pn junction and the contact region is fully depleted before breakdown at the second pn junction occurs.

34 Claims, 20 Drawing Figures

12A

12B

12C

12D

12E

SEMICONDUCTOR DEVICE

CROSS REFERENCE TO RELATED APPLICATION

This application is related to another application entitled "Field Effect Transistor With Insulated Gate Electrode", Francois. M. Klaassen et al, inventors, filed simultaneously herewith, now U.S. Pat. No. 4,233,617.

BACKGROUND OF THE INVENTION

1. Field of the Invention

This invention relates to semiconductor devices generally, and in particular to one having a semiconductor body including at least a bipolar high voltage semiconductor circuit element, said bipolar circuit element having an island-shaped first region of a first conductivity type adjoining a substantially flat surface, said first region forming with an underlying second region of the second conductivity type a first pn-junction extending substantially parallel to the surface, the first region being laterally bounded at least partly by a second pn-junction with an associated depletion zone which is formed between the first region and a third region of the second conductivity type extending between the second region and the surface, said second pn-junction having a lower breakdown voltage than the first pn-junction, a contact region adjoining the surface and the first region.

This invention further relates to a semiconductor device with a semiconductor body having a substantially flat surface including at least one field effect transistor having a source electrode and a drain electrode, a channel region between said source and drain electrodes and a gate electrode adjoining the channel region to influence, by means of a gate voltage applied to the gate electrode, a depletion zone for controlling a flow of charge carriers between the source and drain electrodes, the field effect transistor comprising a layer-shaped first region of a first conductivity type which, with an underlying second region of the second conductivity type, forms a first pn junction extending substantially parallel to the surface, whereby, at least in the operating condition, an island-shaped portion of the first region is bounded laterally at least partly, by a second pn junction with an associated depletion zone which is formed between the first region and a third region of the second conductivity type which adjoins the first region, said second pn junction having a lower breakdown voltage than the first pn junction, at least the gate electrode adjoining the island-shaped region portion.

2. Description of the Prior Art

A semiconductor device including a bipolar high voltage semiconductor element as described above is disclosed in British Pat. No. 1,098,760.

In planar bipolar semiconductor circuit elements of the conventional type a pn-junction is formed by an island-shaped part (the first region) of a layer situated on a substrate (the second region) of the opposite type. Said first region may be, for instance, the base zone of a bipolar transistor. The pn junction between the island and the substrate extending parallel to the surface constitutes the above-mentioned first pn junction, while the second pn junction is formed between the island and, for instance, a diffused insulation zone of the opposite conductivity type bounding the island laterally.

In many cases, the breakdown voltage which can be achieved in these devices between the first and the second region is insufficient. This is because long before the breakdown voltage of the first pn junction to be expected theoretically on the basis of the doping profile is reached, breakdown already occurs at the surface at the second pn junction as a result of the unfavorable field distribution prevailing there due to the high doping concentration and doping gradients as well as due to the presence of surface states, or curvature near the pn-junction edge.

Attempts have been made to improve this by etching grooves in the semiconductor surface which extend downwards into the second region and replace the diffused insulation zones. As a result of this the described edge effects are avoided at least partly, since the remaining pn junction now extends entirely parallel to the surface and terminates in the groove.

However, this method has two important disadvantages. Firstly, the surface is no longer flat so that upon providing the metallization, problems occur with the grooves and the possibility of fracture in the metallization pattern arises. Secondly, the angle at which the pn junction (normally formed between a higher doped and a lower doped region) intersects the wall of the groove is generally unfavorable (acute angle in the more highly doped region).

In order to mitigate this, the wall of the groove is usually passivated with a glass layer in which (usually negative) electric charges have been provided. As a result of this, the unfavorable field distribution at the surface can be corrected. At higher temperatures which may sometimes occur in the operating condition in high-voltage transistors, said types of glass, however, may lose their electric charge and become inoperative.

In the above-mentioned British Patent 1,098,760 there is described a bipolar transistor in which a higher doped zone adjoining the emitter zone is provided in the base region, the depletion layer of the collector-base junction extending in a direction transverse to the surface up to said highly doped zone.

One of the objects of the invention is to provide a semiconductor device having a bipolar high-voltage semiconductor circuit element, for instance a transistor, in which the breakdown voltage of the collector-base junction is practically not reduced by the field distribution at the surface and in which the semiconductor surface can remain entirely flat.

Another object of the invention is to provide a semiconductor device having a bipolar high voltage semiconductor circuit element in which complicated passivating means need not be used.

Still a further object of the invention is to provide a bipolar high-voltage transistor which is insulated from the substrate and has a very high collector-base breakdown voltage, for use in monolithic integrated circuits.

A semiconductor device of the kind described having a field effect transistor is known, for example, from U.S. Pat. No. 3,586,931.

Influencing a depletion zone for controlling the flow of charge carriers is to be understood to mean in this Application either the narrowing or widening, by means of variation of the thickness of a depletion zone, of a current channel bounded by said depletion zone, or the variation, by means of variation of the potential distribution in a depletion zone, of a flow of charge carriers moving through said depletion zone.

The field effect transistor may have various structures in accordance with the form of the source, drain and gate electrodes. For example, these electrodes may have the form of metal layers which form on the semiconductor surface ohmic source and drain contacts, and one or more rectifying gate electrodes with Schottky contacts. Alternatively, the source, drain and gate electrodes may be formed by metal layers adjoining semiconductor electrode zones which form, with the adjoining part of the semiconductor, pn junctions (in the case of gate electrodes) or non-rectifying junctions (for the source and drain electrodes). Furthermore, the gate electrodes may have the form of a conductive layer which is separated from the semiconductor surface by an insulating layer and with which the said depletion zone is formed in the channel region as, for example, in a so-called "deep depletion" field effect transistor. Consequently, when in this Application there is referred to source, drain and gate electrodes, this includes the electrode zones and insulating layers, respectively, possibly associated with said electrodes.

In the known field effect transistors of the kind described, in general no high voltages can be applied across the first and second pn junctions. This is due inter alia to the fact that, long before the breakdown voltage of the first pn junction to be expected theoretically on the basis of the doping profile is reached, breakdown already occurs at the second pn junction as a result of the unfavorable field distribution prevailing there. Said breakdown usually occurs at or in the immediate proximity of the surface. The unfavorable field distribution may be caused by a high doping concentration of the third region and/or by a high doping gradient near the second pn junction, but also, for instance, by a high local curvature of the second pn junction.

In order to increase the admissible voltage, the doping concentration of the first region may be reduced and also, in order to make space for the depletion zone thereby further extending in the first region, the thickness thereof may be increased. However, since the channel conductivity is proportional to the thickness, but the pinch-off voltage is proportional to the square of the thickness of the channel region, said measure will have for its result that, with the length and width of the channel remaining the same and with the pinch-off voltage remaining the same, the channel conductivity is reduced. In fact, for the pinch-off voltage $V_p$ it is found that $$V_p = \frac{a^2 qN}{2\epsilon}$$

and for the channel conductivity it is found that $$G = \frac{Wq \mu Na}{L},$$

where a is the thickness of the channel region pinched-off by the gate electrode, N is the doping concentration of the channel region, W is the width and L is the length of the channel region, $\mu$ is the mobility of the charge carriers, q is the electron charge and $\epsilon$ is the dielectric contact of the semiconductor material. When N is reduced to a value $N' = (N/\beta)(\beta > 1)$, then it is found (for the pinch-off voltage $V_p$ remaining the same) that:

$$a' = \sqrt{\frac{2\epsilon \beta V_p}{qN}} = a\sqrt{\beta}$$

-continued
and $$G' = \frac{Wq \mu Na}{L\sqrt{\beta}} = \frac{G}{\sqrt{\beta}} < G.$$

Generally, however, such a reduction of the channel conductivity is very detrimental for the good operation of the field effect transistor.

One of the objects of the invention is to provide a semiconductor device with a flat surface including a field effect transistor of a new structure, which device may be used at very much higher voltages than known field effect transistors of the kind described, without reducing the channel conductivity.

The invention is based inter alia on the recognition of the fact that, in contrast with what could be expected, this can be achieved by not increasing the thickness of the first region but by decreasing it.

SUMMARY OF THE INVENTION

According to the invention, a semiconductor device, having a semiconductor body including at least a bipolar high voltage semiconductor circuit element, said bipolar circuit element having an island-shaped first region of a first conductivity type adjoining a substantially flat surface, said first region forming with an underlying second region of the second conductivity type a first pn junction extending substantially parallel to the surface, the first region being laterally bounded at least partly by a second pn junction with an associated depletion zone which is formed between the first region and a third region of the second conductivity type extending between the second region and the surface, said second pn junction having a lower breakdown voltage than the first pn junction, a contact region adjoining the surface and the first region being provided, said contact region being bounded at least laterally by the first region, is characterized in that the doping concentration and the thickness of the first region are so small that upon applying a voltage in the reverse direction between the first and the second region the depletion zone at least between the contact region and the third region extends from the first p-n junction up to the surface at a voltage between said first and second regions which is lower than the breakdown voltage of the second p-n junction.

Since the first region of the first conductivity type is already totally depleted at a voltage which is lower than the breakdown voltage of the second pn junction between the first and the third region, the breakdown voltage is no longer determined by said second junction but mainly by the first pn junction extending parallel to the surface. When a voltage is applied in the reverse direction between the second region and the contact region, after full depletion of the first region substantially the whole reverse voltage stands between the said contact region and the boundary of the depletion zone in the second region (which, if desired, may also be totally depleted before breakdown occurs).

In addition to the high breakdown voltage thus obtained, which in certain circumstances can approach the theoretically highest breakdown voltage, an important aspect of the invention is also that at the surface, due to the fully depleted state of the first region, few or no passivating problems will occur. Working with unstable types of glass which are difficult to compose hence becomes unnecessary and in some cases a passivating layer may be omitted entirely.

In order to optimize the advantages of the invention, the distance from the edge of the contact to the second pn junction should not be too small in order to prevent too high a field strength occurring prematurely at the surface between the contact region and the second pn junction. Therefore, the distance, taken along the surface, from the contact region to the second pn junction will preferably be larger than the distance over which the depletion zone associated with the second pn junction extends along the surface at the breakdown voltage of said second pn junction. Although a considerable reduction of the surface field strength is obtained in all cases by the said depletion condition, a further optimization of the breakdown voltage proves to be achievable when the maxima in the field strength which occur at the second pn junction and at the edge of said contact region are also approximately of the same value. As will be explained in detail hereinafter with reference to the drawings, a preferred embodiment is therefore characterized in that the doping concentration N in atoms per cm$^3$ and the thickness d in cm of the first region satisfy the condition $$2.6 \cdot 10^2 \cdot \epsilon E \sqrt{\frac{V_B}{L}} \leq Nd \leq 5.1 \cdot 10^5 \epsilon E$$

wherein $\epsilon$ is the relative dielectric constant and E the critical field strength in volt/cm at which avalanche multiplicaton occurs in the semiconductor material of the first region, L is the distance in cm from the contact region up to the second pn junction, and $V_B$ is the unidimensionally computed value of the breakdown voltage of the first pn junction in volts. When in this case the following conditions are chosen:

N. d is substantially equal to $3.0 \cdot 10^5 \epsilon E$ and $L \geq 1.4 \cdot 10^{-5}$ V it is ensured that the maximum field strength at the first pn junction will always be larger than in the above-mentioned maxima occurring at the surface so that the breakdown always occurs at the first pn junction and not at the surface. In order to be able to store the major part of the charge in the depletion region in the second region, thus reducing the minimum thickness of the first region, it is often preferred that the second region at least adjacent the first region has a lower doping concentration that the first region.

Although in many cases the depletion zone of the first pn junction may extend without harm throughout the thickness of the second region, in other cases it is preferably ensured that the second region has such a thickness that at the breakdown voltage of the first pn junction the depletion zone extends in the second region over a distance smaller than the thickness of said region. In that case it is ensured that the breakdown voltage cannot be adversely influenced by the thickness of the second region.

Although the semiconductor structure described may also be formed differently, for technological reasons a construction is preferred in which the first region is formed by an epitaxial layer of the first conductivity type provided on the second region. The third region adjoining the first region need not extend throughout the thickness of the first region. It is sufficient that, at least in the operating condition, the associated depletion zone extends over the whole thickness of the first region and bounds the island-shaped first region over at least a part of its circumference. Preferably, however, the first region is bounded laterally entirely by the second pn junction, although other structures will sometimes be preferred in which the first region is bounded laterally, for example, partly by the second pn junction and for the remaining part in a different manner, for example by a recessed insulating material or by a groove filled, for example, with passivating glass.

The high-voltage bipolar semiconductor circuit element may be, for instance, a diode. The contact region may be an electrode or an electrode zone which is connected directly to the source of the reverse voltage but may alternatively be, for example, a semiconductor zone which itself is not provided with a connection conductor but is brought at the desired potential in a different manner, for example, by an adjoining semiconductor zone.

According to an important preferred embodiment said island-shaped first region forms one of the collector and base zones of a bipolar high-voltage transistor, said contact region being a fourth semiconductor region of the first conductivity type having a higher doping concentration than the first region and being surrounded at least laterally by the first region. In this embodiment the fourth region may extend over only a part of the thickness of the first region, but also from the surface down to the second region. For some applications this has advantages, as will be apparent from the examples.

In many applications the invention is used to obtain a high-voltage transistor which is either a discrete component or forms part of a more complicated semiconductor circuit element. Therefore, according to an important preferred embodiment a surface-adjoining emitter zone of the second conductivity type which is further fully surrounded by the fourth region is provided in the fourth region, the first region and the fourth region together constituting the base zone and the second region constituting the collector zone of the transistor. According to a further preferred embodiment the first region forms part of a first epitaxial layer of the first conductivity type and is separated from the remaining part of the first epitaxial layer by the third region, and the second region is an island-shaped part of a second epitaxial layer of the second conductivity type which is provided on a substrate of the first conductivity type, which island-shaped part is separated from the remaining part of the second epitaxial layer by an isolation zone of the first conductivity type not adjoining the first and the third regions and extending from the first epitaxial layer down to the substrate. This structure is of importance since it can easily be integrated.

The transistor may form part of a more complicated semiconductor circuit element. An important preferred embodiment is that in which the second region adjoins an underlying further region of the first conductivity type, which further region together with the second region, the first region, the fourth region and the zone of the second conductivity type provided therein forms a thyristor. The further region will advantageously be connected to the surface by a highly doped zone of the first conductivity type not adjoining the first and the third region.

A particularly advantageous embodiment of these thyristor constructions in which the principle of the invention is used on two sides is characterized in that the second region is a semiconductor layer of the second conductivity type on which a combination of the first, third and fourth regions is provided on both sides, a surface zone of the second conductivity type being embedded on at least one side in the fourth region.

A quite different preferred embodiment of a bipolar transistor according to the invention is characterized in that a base zone of the second conductivity type and therein an emitter zone of the first conductivity type are provided in the first region, the first and fourth regions constituting together the collector zone of the transistor. In this embodiment the base zone may adjoin and merge into the third region. This "semilateral" transistor structure is also excellently suitable for use in monolithic integrated circuits.

Furthermore, according to the invention as it pertains to field effect transistors, a semiconductor device with a semiconductor body having a substantially flat surface including at least one field effect transistor having a source electrode and a drain electrode, a channel region between said source and drain electrodes and a gate electrode adjoining the channel region to influence, by means of a gate voltage applied to the gate electrode, a depletion zone for controlling a flow of charge carriers between the source and drain electrodes, the field effect transistor comprising a layer-shaped first region of a first conductivity type which, with an underlying second region of the second conductivity type, forms a first pn junction extending substantially parallel to the surface, whereby, at least in the operating condition, an island-shaped portion of the first region is bounded laterally at least partly, by a second pn junction with an associated depletion zone which is formed between the first region and a third region of the second conductivity type which adjoins the first region, said second pn junction having a lower breakdown voltage than the first pn junction, at least the gate electrode adjoining the island-shaped region portion. The doping concentration and the thickness of the first region are so small that in the presence of a voltage in the reverse direction between the second region and a contact region of the field effect transistor belonging to the source, drain and gate electrodes and forming a non-rectifying contact with the island-shaped region portion, the depletion zone, at least between said contact region and the second pn junction, extends from the first pn junction throughout the thickness of the island-shaped region portion at a voltage which is lower than the breakdown voltage of the second pn junction.

The contact region may be an electrode or an electrode zone which is connected directly to the source of the reverse voltage but may alternatively be, for example, a semiconductor zone which itself is not provided with a connection conductor but is brought at the desired potential in a different manner, for example, via an adjoining semiconductor zone.

Since the island-shaped region portion of the first conductivity type between the contact region and the second pn junction is already fully depleted at a voltage which is lower than the breakdown voltage of the second pn junction, the field strength at the surface is reduced to such an extent that the breakdown voltage is no longer determined substantially entirely by said second pn junction but to a considerable extent by the first pn junction extending parallel to the surface.

In this manner a very high breakdown voltage can be obtained between the first and the second region which in certain circumstances can approach the high breakdown voltage to be expected theoretically on the basis of the dopings of the first and second regions.

In order to obtain the full benefit of the invention as regards the breakdown voltage, it will preferably be ensured that, taken along the surface, the distance from the said contact region to the second pn junction is greater than the distance over which the depletion zone associated with the second pn junction extends along the surface at the breakdown voltage of said second pn junction. As a result of this it is prevented that upon increasing the voltage between the first and the second region too high a field strength occurs prematurely at the surface between the contact region and the second pn junction as a result of the penetration of the depletion zone from the second pn junction up to said contact region.

Although a considerable reduction of the surface field strength is obtained in all cases by the depletion condition, a further optimization of the breakdown voltage proves to be achievable when the maxima in the field strength which occur at the second pn junction and at the edge of the said contact region are also approximately of the same value. As will be explained in detail hereinafter with reference to the drawings, a preferred embodiment is therefore characterized in that the doping concentration N in atoms per cm$^3$ and the thickness d in cm of the island-shaped region portion satisfy the condition $$2.6 \cdot 10^2 \epsilon E \sqrt{\frac{V_B}{L}} \leq Nd \leq 5.1 \cdot 10^5 \epsilon E$$

wherein $\epsilon$ is the relative dielectric constant and E the critical field strength in Volt/cm at which avalanche multiplication occurs in the semiconductor material of the first region, L is the distance in cm from the said contact region up to the second pn junction, and $V_B$ is the unidimensionally computed value of the breakdown voltage of the first pn junction in Volts. When in this case the conditions are moreover chosen to be so that $N \cdot d$ is substantially equal to $3.0 \cdot 10^5 \epsilon E$ and $L \geq 1.4 \cdot 10^{-5} V_B$, it is ensured that the maximum field strength at the first pn junction will always be larger than in the above-mentioned maxima occurring at the surface so that the breakdown always occurs at the first pn junction and not at the surface.

In order to be able to store the major part of the charge in the depletion region in the second region, thus reducing the minimum thickness of the first region, it is often preferred that the second region of least adjacent the first region has a lower doping concentration than the first region.

Although in many cases the depletion zone of the first pn junction may extend without harm throughout the thickness of the second region, in other cases it is preferably ensured that the second region has such a thickness that at the breakdown voltage of the first pn junction the depletion zone extends in the second region over a distance smaller than the thickness of said region. In that case it is ensured that the breakdown voltage cannot be adversely influenced by the thickness of the second region.

Although the semiconductor structure described may also be formed differently, a construction is preferred, inter alia for technological reasons, in which the first region is formed by an epitaxial layer of the first conductivity type provided on the second region. The third region adjoining the first region need not extend throughout the thickness of the first region. It is sufficient that, at least in the operating condition, the associated depletion zone extends over the whole thickness of the first region and, over at least a part of its circumference, bounds an island-shaped portion thereof. Preferably, however, the island-shaped portion of the first region is bounded laterally entirely by the second pn junction, although other structures will sometimes be preferred in which the portion of the first region is bounded laterally, for example, partly by the second pn junction and for the remaining part in a different manner, for example by a recessed insulating material or by a groove filled, for example, with passivating glass.

The invention is of particular importance in lateral field effect transistors in which the current between the source electrode and the drain electrode flows substantially parallel to the surface. Therefore, a preferred embodiment is characterized in that the source and drain electrodes on either side of the gate electrode constitute non-rectifying contacts with the first region, said contact region being the drain electrode of the transistor. In this case the gate electrode is usually connected to the second region which then serves as second gate electrode, although this is not necessary.

In certain cases an embodiment will be preferred in which the drain electrode is surrounded substantially entirely by the gate electrode and this latter substantially entirely by the source electrode. A particular preferred embodiment is characterized in that a semiconductor layer of the second conductivity type is present on the first region, that the source and drain electrodes comprise electrode zones of the first conductivity type and the gate electrode comprises an electrode zone of the second conductivity type, and that all said electrode zones extend throughout the thickness of the said semiconductor layer down to the first region. This latter preferred embodiment enables the juxtaposed arrangement in the same semiconductor plate of complementary junction field-effect transistors, that is n-channel and p-channel field effect transistors, as will be described hereinafter.

Besides in lateral junction field effect transistors the invention may also be used advantageously in junction field effect transistors of the so-called vertical type. In connection herewith a preferred embodiment is characterized in that the field effect transistor is of the vertical type, that the drain electrode forms a non-rectifying contact with the second region, that the source electrode constitutes a rectifying contact with the first region, and that the gate electrode comprises an electrode zone of the first conductivity type which surrounds at least one part of the first region associated with the channel region and forms the contact region.

BRIEF DESCRIPTION OF THE DRAWINGS

The invention will now be described in greater detail with reference to a number of examples and the drawings, in which.

DESCRIPTION OF THE PREFERRED EMBODIMENTS

Figure 1:
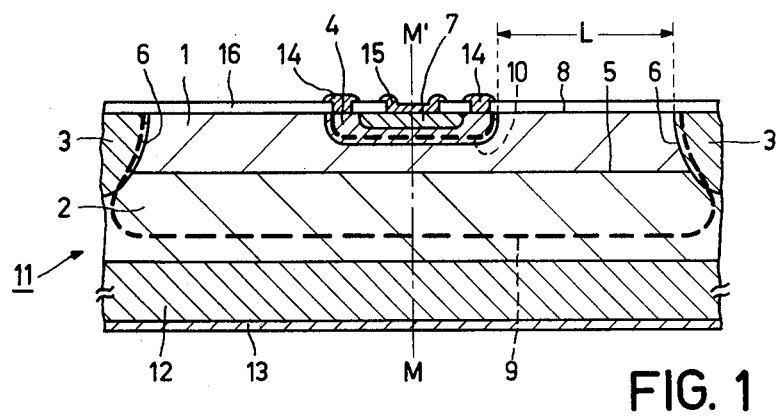
FIG. 1 is a diagrammatic cross-sectional view of a semiconductor device having a bipolar high voltage transistor according to the invention.

The Figures are diagrammatic and, for clarity, not drawn to scale. Corresponding parts are generally referred to by the same reference numerals. Semiconductor regions of the same conductivity type are as a rule shaded in the same direction.

In all the embodiments, silicon has been chosen as a semiconductor material. However, the invention is not restricted thereto but may be applied while using any other semiconductor material, for example germanium or a so-called III-V compound, for example GaAs.

FIG. 1 is a diagrammatic cross-sectional view of a semiconductor device having a bipolar voltage transistor, according to the invention. One possible embodiment of the device of this example will be described in detail, it being understood that many variations are possible and feasible. The device of FIG. 1 is symmetrical about an axis M—M'. It has a semiconductor body 11 of silicon, (other semiconductor materials may also be used). The semiconductor body 11 includes a bipolar high-voltage semiconductor circuit element, in this example a transistor, with successively an emitter zone, a base zone and a collector zone of alternate conductivity types, in this example an n-type emitter zone, a p-type base zone and an n-type collector zone. One of the collector and base zones, in this example the base zone, comprises an island-shaped first region 1 of a first conductivity type, in this case the p-conductivity type, which adjoins a substantially flat surface 8 and which forms with an underlying second region 2 of the second conductivity type, in this case the n-type, a first pn junction 5 extending substantially parallel to the surface 8. The first region 1 is bounded laterally at least partly, and in this example entirely, by a second pn junction 6 which is formed between the first region 1 and a third region 3 of the second, n-conductivity type having a higher doping concentration than the second region 2 and extending between the second region 2 and the surface 8. The pn junction 6 has a lower breakdown voltage than the first pn junction 5, since the doping of region 3 is higher than that of a region 2. Furthermore, contact region, which in this example is a fourth region 4 of the first p-conductivity type having a higher doping than the first region 1, is provided in the first region 1 and adjoins the surface 8. The fourth region 4 adjoins and is bounded at least laterally by the first region 1 and together with the region 1 constitutes the base zone. A surface-adjoining n-type emitter zone 7 which is further fully surrounded by the region 4 is provided in the fourth region 4. A highly doped n-type layer 12 on which a metal layer 13 forms an ohmic collector contact is provided on the lower side. Present on the surface 8 is also an electrically insulating layer 16, in this example of silicon oxide, and, through windows therein, the zones 4 and 7 are contacted with metal layers 14 and 15.

The transistor structure described thus far normally would have a collector-base breakdown voltage which is considerably lower than the breakdown voltage to be expected theoretically on the basis of the doping of the various semiconductor regions, and the breakdown would occur at the surface. This is caused inter alia by surface states and by the high doping of the region 3. All this gives rise to a field distribution along the surface 8 in which the maximum field strength occurs near the place where the pn junction 6 intersects the surface, so that breakdown occurs at the surface.

According to the invention, the doping concentration and the thickness of the first region 1 are so small that upon applying a voltage in the reverse direction between the first region 1 and the second region 2, the depletion zone at least between the contact region 4 and the third region 3 already extends from the first pn junction 5 up to the surface 8 at a voltage between the first region 1 and the second region 2 which is lower than the breakdown voltage of the second pn junction 6. The boundaries 9 and 10 of the depletion zone in this condition are shown in broken lines in FIG. 1. The breakdown voltage is now no longer determined primarily by the pn junction 6 but mainly by the pn junction 5 which, as a result of the comparatively low doping of both the region 1 and the region 2, has a much higher breakdown voltage, due to the more favorable field distribution of the surface.

The device shown in FIG. 1 may be manufactured, for example, as follows. The starting material is a highly doped n-type silicon substrate 12 having a resistivity of, for example, 0.001 ohm·cm. On said substrate an n-type epitaxial layer 2 having a thickness of approximately 40 μm and a resistivity of 50 ohm·cm (doping $10^{14}$ atoms/cm$^3$) is deposited by using conventional techniques. On said layer a p-type layer 1 is deposited epitaxially in a thickness of 10 μm and a resistivity of approximately 25 ohm·cm (doping $5,5 \cdot 10^{14}$ atoms/cm$^3$). The insulation zone 3 is then provided by a deep n-type diffusion, for example of phosphorus, after which an oxide layer 16 is provided and, through windows in said oxide layer, by using conventional diffusion and/or implantation methods, a highly doped p-type zone 4 having a thickness of 5.5 μm and therein a highly doped n-type emitter zone 7 having a thickness of 3 μm are provided. Contacts in the form of metal layers 13, 14 and 15 are then provided on the regions 12, 4 and 7. The transistor shown in FIG. 1 is then obtained. As a result of the doping and thickness chosen for the layers 1 and 2, the island-shaped region 1 which is surrounded by the zone 3, is depleted entirely from the pn junction 5 up to the surface 8 already at a voltage of 250 volts in the reverse direction across the collector-base junction 5. When the collector-base voltage is further increased, the depletion zone will extend into the region 2 until finally at a voltage of approximately 800 volts breakdown occurs.

The distance d from the "fourth region" or contact region 4 up to the edge of the first region 1, that is to say up to the pn junction 6, along the surface (see FIG. 1) in this example is 73 μm. This is larger than the distance (approximately 30 μm) over which the depletion zone of the second pn junction 6, taking into account the doping concentration of the regions 1 and 3, would extend in the lateral direction at the breakdown voltage of said junction 6 in the absence of the pn junction 5, which breakdown voltage is approximately 370 volts. The depletion zone which upon increasing the collector-base voltage would extend from the pn junction 6 laterally into the region 1 thus does not reach the region 4 until the depletion zone extending from the pn junction 5 upwards has reached the surface 8. As a result of this, high field strengths at the surface are avoided and the breakdown is determined substantially entirely by the properties of the first pn junction 5.

In this example the uni-directionally calculated breakdown voltage $V_B$ is that of the P+PN-diode (4, 1, 2) in which region 1 between 4 and 2 is fully depleted and has a thickness of 4.5 μm This breakdown voltage is calculated according to the equation $$V_B = E d_1 - \frac{q N_1 d_1^2}{2\epsilon_o \epsilon} + \frac{1}{2} E^2 \frac{\epsilon_o \epsilon}{q N_2}$$

where $\epsilon$ and E have the earlier mentioned meanings, $d_1$ and $N_1$ are the thickness (in cm) and doping concentration (in atoms/cms$^3$) of region 1 between regions 2 and 4, $\epsilon_o$ the permittivity (in Farad/cm) of free space, q the electron charge in Coulomb and $N_2$ the doping concentration (in atoms/cm$^3$) of region 2. One finds, in this case: $V_B = 2126$ Volt. Consequently the device of this example satisfies the earlier mentioned equation $$2,6 \cdot 10^2 \, \epsilon E \sqrt{\frac{V_B}{L}} \leq N \cdot d \leq 5,1 \cdot 10^5 \epsilon E$$

where $\epsilon = 11,7$ and $E = 2,5 \cdot 10^5$ Volt/cm in silicon, $L = 7,3 \cdot 10^{-3}$ cm, $N = 5,5 \cdot 10^{14}$ cm$^{-3}$ and $d = 10^{31}$ $^3$ cm, since $$2,6 \cdot 10^2 \, \epsilon E \sqrt{\frac{V_B}{L}} = 4,10 \cdot 10^{11}$$

$$N \cdot d = 5,5 \cdot 10^{11}$$
$$\text{and } 5,1 \cdot 10^5 \, \epsilon E = 1,49 \cdot 10^{12}$$

Figure 2:
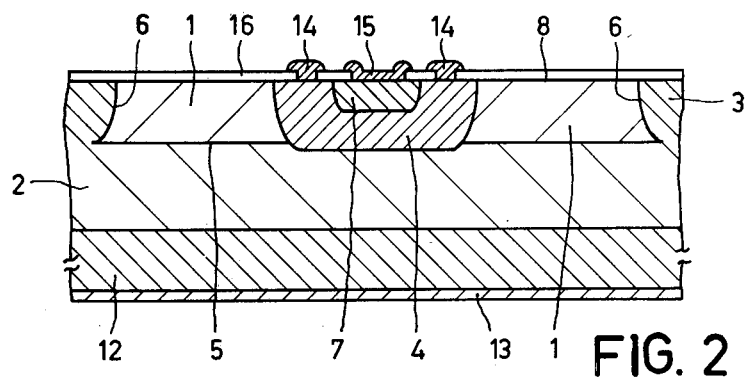
FIG. 2 is a diagrammatic cross-sectional view of a modified embodiment of the device shown in FIG. 1.

FIG. 2 is a diagrammatic cross-sectional view of a modified embodiment of the bipolar high voltage transistor shown in FIG. 1. According to this embodiment, the fourth region 4 extends up to and for a small part into the second region 2, while it is surrounded laterally, as in FIG. 1, by the first region 1. Otherwise the dimensions and dopings may be equal to those of FIG. 1. In certain circumstances, this embodiment may be of advantage, for example, to favorably influence the frequency behaviour, especially at high current densities. All this, however, is slightly at the expense of the collector-base breakdown voltage.

In the examples of FIGS. 1 and 2, the layer 2 has such a thickness that upon breakdown the depletion zone does not yet extend over the whole thickness of the layer 2. However, this need not be the case and, provided the thickness of the layer 2 be sufficiently large to achieve the desired breakdown voltage, the depletion zone may extend up to the region 12 prior to reaching said breakdown voltage.

Figure 3:
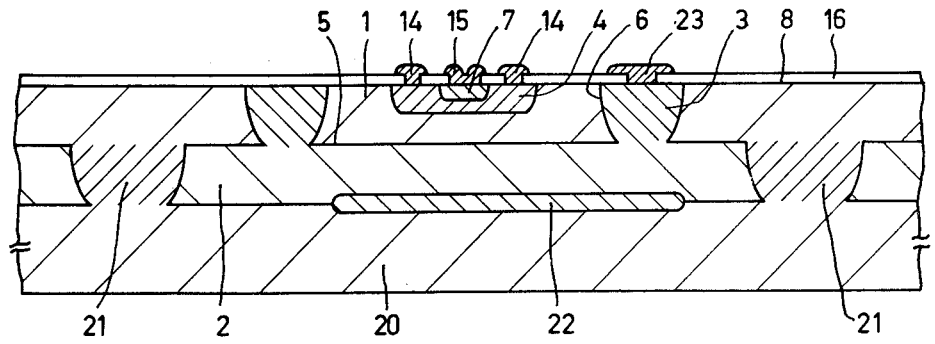
FIG. 3 shows a form of the device shown in FIG. 1, which can be readily integrated.

FIG. 3 is a diagrammatic cross-sectional view of a readily integratable form of the bipolar high voltage transistor shown in FIG. 1. The first region 1 forms part of a first epitaxial layer of the first conductivity type and is separated from the remaining part of said first epitaxial layer by the third region 3. The second region 2 is an island-shaped part of a second epitaxial layer of the second conductivity type which is provided on a substrate 20 of the first conductivity type. The region 2 is separated from the remaining part of the second epitaxial layer by an isolating zone 21 of the first conductivity type not adjoining the first region 1 and the third region 3 and extending from the first epitaxial layer down to the substrate 20. In order to reduce the collector resistance, a buried layer 22 of the second conductivity type is provided. The collector contact 23 in this embodiment is situated on the surface 8 on the zone 3. In this case also the principle holds again that the region 1 must be depleted entirely from the pn junction 5 down to the region 4 before breakdown of the pn junction 6 occurs.

Figure 4:
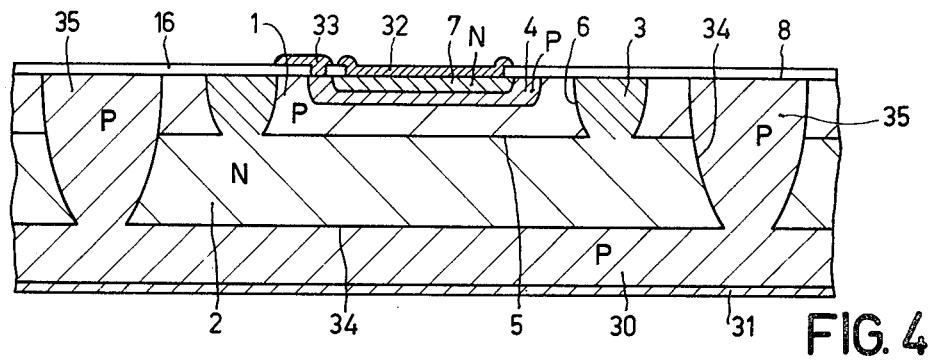
FIG. 4 is a diagrammatic cross-sectional view of another embodiment of the device of FIG. 1 according to the invention.

FIG. 4 is a diagrammatic cross-sectional view of another embodiment of the device according to the invention. The second region 2 of the second conductivity type adjoins an underlying further region 30 of the first conductivity type which together with the second low-doped region 2 of the second conductivity type, the low-doped first region 1 of the first conductivity type, the highly doped fourth region 4 of the first conductivity type and the zone 7 of the second conductivity type provided therein forms on thyristor. In this example, the first conductivity type is taken to be p and the second conductivity type is taken to be n. An anode contact 31 is provided on the region 30, a cathode contact 32 is provided on the zone 7 and a control electrode 33 is provided on the zone 4. (The conductivity types may alternatively be reversed, in which case 31 is the cathode contact and 32 is the anode contact). In this case also the doping and the thickness of the first region 1 are chosen to be such that, upon applying a reverse voltage across the pn junctions 5 and 6, this region is depleted entirely before breakdown of the junction 6 occurs.

The pn junction 34 may terminate at the edge of the semiconductor disk. In the example shown in FIG. 4, however, the device has a complete planar construction by providing (for example by aluminum diffusion) the deep p-type zone 35 which does not adjoing the regions 1 and 3 and which connects the p-type region 30 with the surface 8. As a result of this, the pn junction 34 along the zone 35 also terminates at the surface 8.

Figure 5:
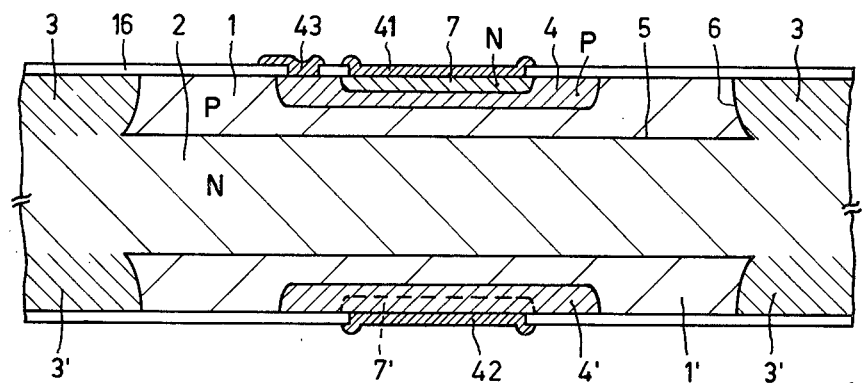
FIG. 5 is a diagrammatic cross-sectional view of a modified embodiment of the bipolar transistor device shown in FIG. 4.

A device having a thyristor may alternatively be formed as shown in the cross-sectional view of FIG. 5, in addition to the manner shown in FIG. 4. In this case the second region 2 is a semiconductor layer of the second conductivity type, in this example, n-type, on which on both sides a combination of first, third and fourth regions (1, 3, 4 and 1', 3', 4', respectively) according to the preceding examples is provided. An n-type surface zone 7 is provided in the fourth region 4 on at least one side. In this manner a thyristor is obtained of which the zones 7, 4, 1, 2 1' and 4' in this sequence form the n-p-n-p structure, or, more accurately, the $n^+p^+p^-n^-p^-p^+$ structure. Current contacts 41 and 42 are provided on the zones 7 and 4' and, for example, a control electrode 43 is provided on the zone 4. In this device the deep zones 35 of FIG. 4 which are difficult to provide are superfluous.

In the device shown in FIG. 5, the electrode 42 might also, with objection, extend over the region 1. According to a modified embodiment, however, it is alternatively possible to change this device into a symmetrical device of the "triac" type which has a controllable breakdown voltage in two directions. For that purpose, a highly doped n-type zone 7' may also be provided in the region 4' as s shown in broken lines in FIG. 5. In this manner the n-p-n-p-n structure of a bilaterally operating thyristor is obtained in which, of course, the electrode 42 may contact only the region 7', not counting a possible desired local short-circuit.

Figure 6:
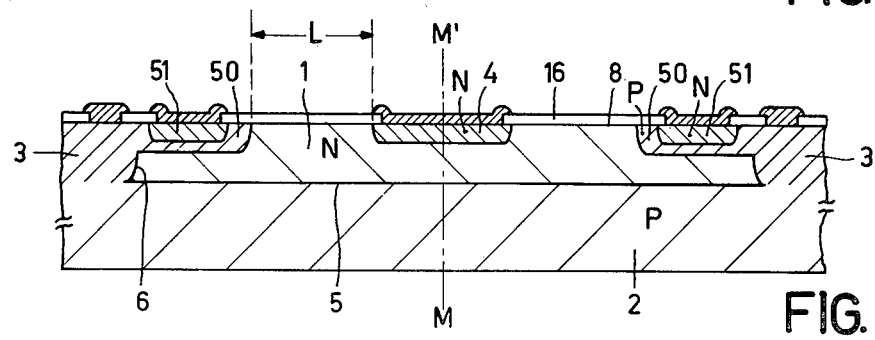
FIG. 6 is a diagrammatic cross-sectional view of a further embodiment of the bipolar transistor device according to the invention.

FIG. 6 is a diagrammatic cross-sectional view of quite a different embodiment of the device according to the invention. In this case also an island-shaped first region 1 of a first conductivity type, in this example n-type, is present which is bounded on the lower side by a p-type second region 2 which forms a pn junction 5 with region 1 and which is laterally bounded by a p-type third region 3 which forms a pn junction 6 with region 1. As in the preceding examples, the doping concentrations chosen are such that the pn junction 6, considering the dopings used, in itself has a lower breakdown voltage than the pn junction 5 and the doping concentration and the thickness of the region 1 are so small that this region upon applying a voltage in the reverse direction across the pn junctions 5 and 6 is depleted entirely long before breakdown at the pn junction 6 occurs.

The device furthermore comprises a bipolar transistor, analogous to that of the preceding examples. However, in this embodiment, region 1 thereof does not form the base zone but forms the collector zone. A p-type base zone 50 is provided in region 1, in which base zone a highly doped n-type emitter zone 51 is provided. The n-type highly doped fourth region 4 which is present in island-shaped region 1 serves as a contact zone for the collector region which is formed by first region 1 and fourth region 4 together.

Base zone 50 is provided so as to adjoin, and merge into, third region 3 and forms with region 1 a continuation of pn junction 6. The device shown is again symmetrical about the line M—M'. The resulting transistor has a very high collector-base breakdown voltage. In this example, region 1 has a doping concentration of $2 \cdot 10^{14}$ atoms/cm$^3$, region 2 has a doping concentration of $1.7 \cdot 10^{14}$ atoms/cm$^3$, the thickness of region 1 between surface 8 and pn junction 5 is 15 μm the thickness of base zone 50 is 7 μm and that of emitter zone 51 and of regin 4 is 4 μm. The collector-base breakdown voltage was 1100 volts. The distance L between fourth region 4 and pn junction 6 (see FIG. 6) is 175 μm, which is more than the distance over which the depletion zone belonging to pn junction 6 would extend laterally at the breakdown voltage of said junction in the absence of pn junction 5. As a result of this no premature breakdown at the surface occurs.

In this example the unidimensionally calculated breakdown voltage $V_B$ is that of the N+NP-diode (4, 1, 2), in which region 1 between 4 and 2 is fully depleted and has a thickness of 11. This breakdown voltage $V_B = 1445$ volt. In this case, where $L=175$, $N=2\cdot 10^{14}$ cm$^{-3}$ and $d=15$ μm $$\text{also } 2{,}6 \cdot 10^2 \, \epsilon \, E \sqrt{\frac{V_B}{L}} \leq N \cdot d \leq 5{,}1 \cdot 10^5 \, \epsilon \, E$$

$$\text{since } 2{,}6 \cdot 10^2 \, \epsilon \, E \sqrt{\frac{V_B}{L}} = 2{,}19 \cdot 10^{11}$$

$$N \cdot d = 3 \cdot 10^{11} \text{ and}$$

$$5{,}1 \cdot 10^5 \, \epsilon \, E = 1{,}49 \cdot 10^{12}$$

Figure 7:
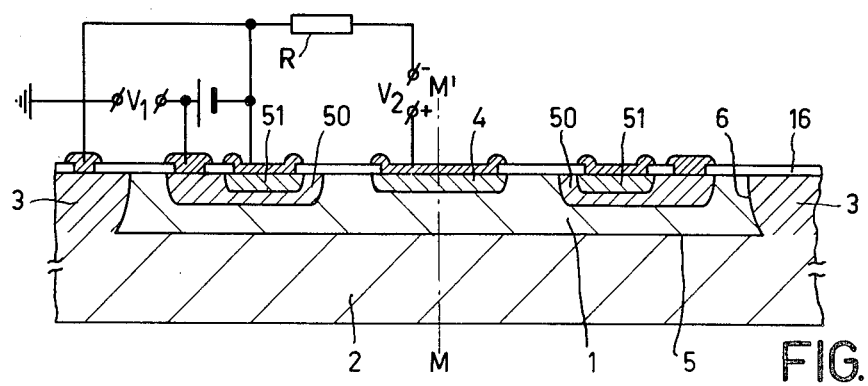
FIG. 7 is a diagrammatic cross-sectional view of a modified embodiment of the device shown in FIG. 6.

In the transistor shown in FIG. 6 base region 50 is connected to substrate 2. In order to obtain a transistor which is insulated with respect to substrate 2, this may be constructed with a small variation as shown in FIG. 7 in which base zone 50 is separated from third region 3 by a part of region 1. The transistor then is insulated from substrate 2. The device is symmetrical, for example rotationally symmetrical, about the line M—M'. A control voltage $V_1$ of, for example, a few volts may be applied between base zone 50 and third region 3. Regions 50 and 3 and 2, respectively, are substantially at the same potential with respect to region 1 when a high collector-emitter voltage $V_2$ is applied, and in this case also a very high collector-base breakdown voltage can be reached as a result of the complete depletion of region 1. A circuit with load resistor R is shown in FIG. 7.

Figure 8:
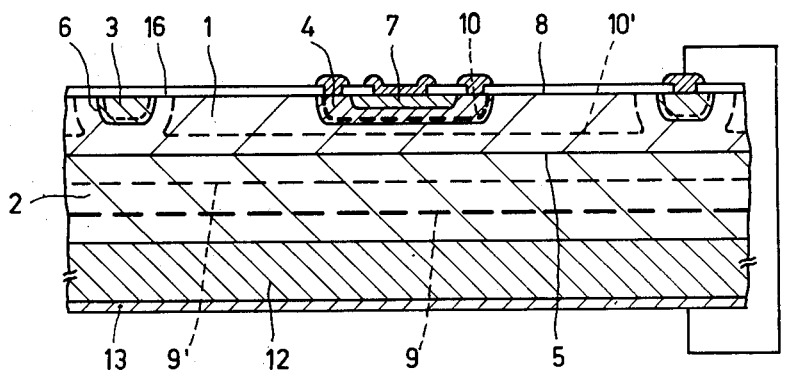
FIGS. 8 and 9 are diagrammatic cross-sectional views of bipolar transistor devices according to the invention with different island insulation.

In order to indicate that third region 3 need not always extend throughout the whole thickness of layer 1, FIG. 8 shows diagrammatically a crossectional view of the same bipolar high voltage transistor as that shown in FIG. 1, with the difference that region 3 extends from surface 8 only over a part of the thickness of layer 1. By ensuring that pn junction 6, as well as pn junction 5, is in the reverse direction, for which purpose region 3 may in practice be advantageously connected to substrate 12, as shown in the drawing, the depletion zone belonging to pn junction 6 may extend into region 2 with a suitable choice of the depth of zone 3, so that the desired island insulation is effected. The boundaries of the depletion zone at low reverse voltage between regions 1 and 3 and 2, respectively, are denoted by broken lines 9' and 10', those with complete depletion of region 1 are denoted by broken lines 9 and 10.

Figure 9:
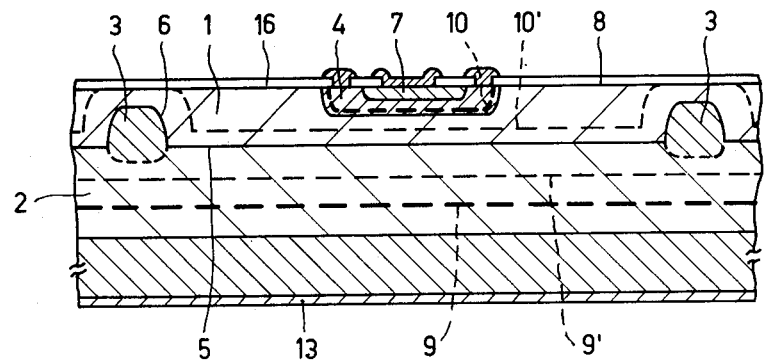

Alternatively, region 3 may extend from region 2 upwards into region 1 without adjoining surface 8, provided the associated depletion zone reaches surface 8, see for example FIG. 9.

As already noted, it is furthermore not necessary for second pn junction 6 to bound island-shaped region 1 laterally entirely. The boundary of region 1 may be effected partly by pn junction 6 and for the remaining part in a different manner. See, for example, FIGS. 10 and 11 in which substantially the same transistor is shown as in FIG. 1, in FIG. 10 as a plan view and in FIG. 11 as a diagrammatic cross-sectional view taken on the line XI—XI.

Figure 10:
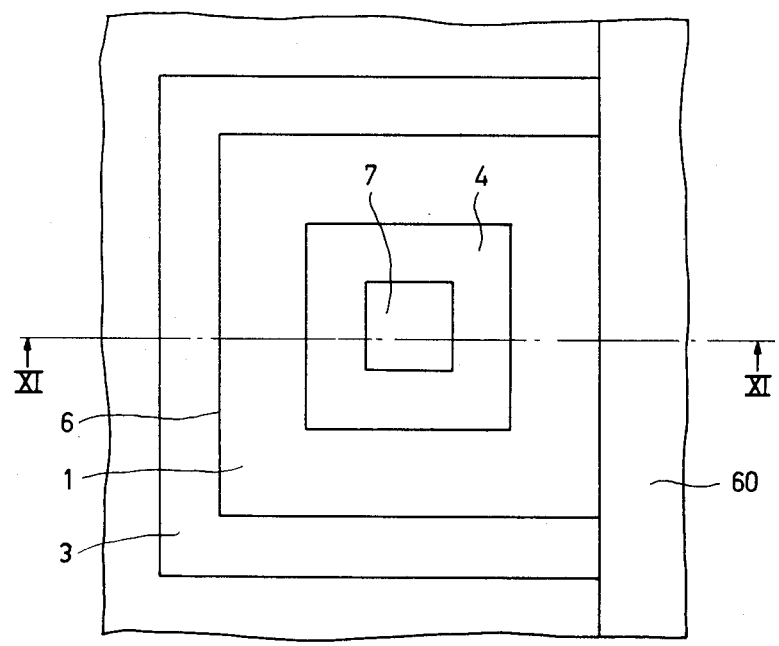
FIG. 10 is a plan view of another embodiment of a semiconductor having a bipolar high voltage transistor according to the invention.
Figure 11:
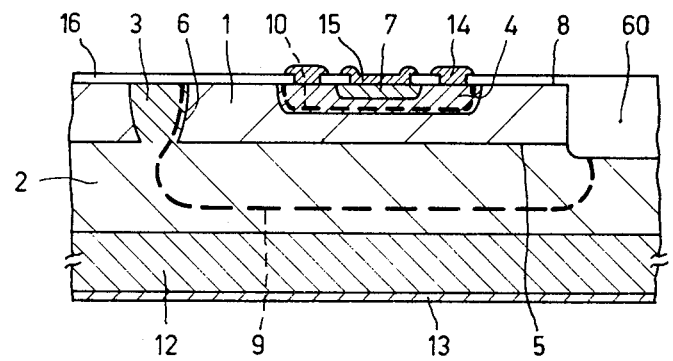
FIG. 11 is a diagrammatic cross-sectional view of the device shown in FIG. 10 taken on the line XI—XI.

In FIG. 10 metal layers 14 and 15 are not shown for clarity. In this example island-shaped region 1 is bounded partly by pn junction 6 and for the remaining part by a sunken pattern 60 of silicon oxide provided by local oxidation. In this case also the depletion zone (9, 10) in region 1 extends from first pn junction 5 up to surface 8 at a reverse voltage across junction 5 which is considerably lower than the voltage at which breakdown near the surface at pn junction 6 would occur in the absence of pn junction 5.

With reference to FIGS. 12A to 12E and 13 the above-mentioned preferred doping concentrations and dimensions will be further explained.

FIGS. 12A to 12E are diagrammatic cross-sectional views of five different possibilities for the field distribution in a diode which corresponds to the island-shaped first region in the preceding examples. For clarity, only half of the diode is shown; the diode assumed to be rotationally symmetrical about the axis denoted by $E_x$. Region 1 corresponds to the island-shaped "first region" in each of the preceding examples, pn junction 5 corresponds to the "first pn junction" and pn junction 6 corresponds to the "second pn junction". In these Figures, region 1 is assumed to be n-conductive and region 2 is assumed to be p-conductive; however, the conductivity types may also be reversed, as is the case in FIGS. 1 and 2. The doping concentration of region 2 is the same in all the FIGS. 12A to 12E.

When between N− region 1 (via N+ contact region 4) and P− region 2 a voltage is applied in the reverse direction across pn junctions 5 and 6, a variation of the field strength distribution $E_s$ occurs along the surface according to the line S, while in the vertical direction the field strength $E_b$ varies according to the line B.

Figure 12:
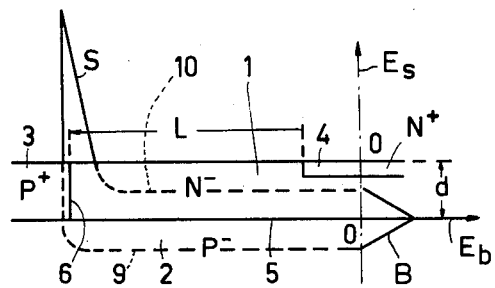
FIGS. 12A to E show the field distribution for various dimensions and dopings.
Figure 12:
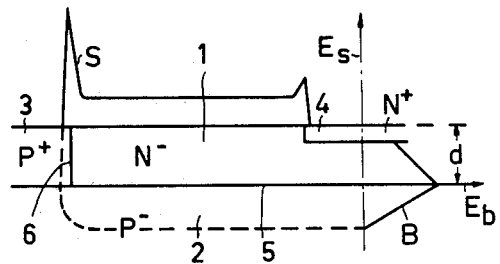
Figure 12:
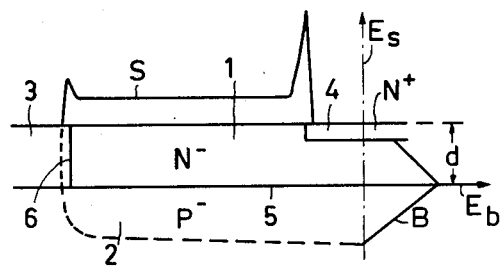
Figure 12:
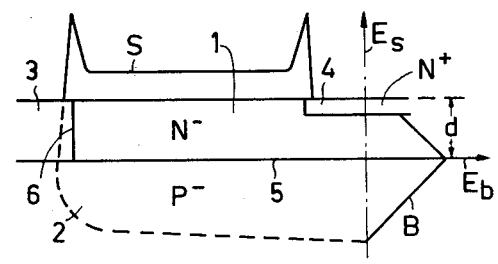
Figure 12:
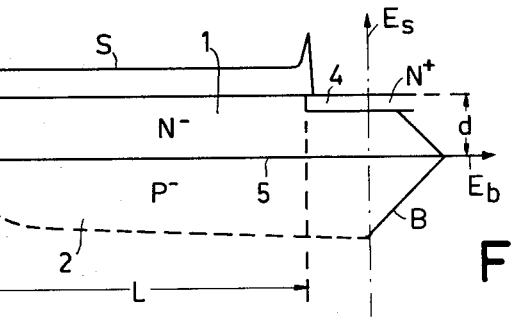

FIG. 12A shows the case in which full depletion of layer 1 does not yet occur at the breakdown voltage. A high maximum value of the field strength $E_s$ occurs at the surface at pn junction 6 which, due to the high doping of p+ region 3, is higher than the maximum value of the field strength $E_b$ which, viewed in a vertical direction, occurs at pn junction 5. When the critical field strength E is exceeded (for silicon approximately $2\cdot 5\cdot 10^5$ volts/cm and slightly dependent on the doping), breakdown occurs at the surface near junction 6 before the depletion zone (shown in broken lines in FIG. 12A) extends in the vertical direction from junction 5 to the surface.

FIGS. 12B to 12E show cases in which the doping concentration N and the thickness d of layer 1 are such that prior to the occurrence of surface breakdown at junction 6, layer 1 is fully depleted from junction 5 up to the surface. Over a part of the track between regions 3 and 4 the field strength $E_s$ along the surface is constant while both at the area of pn junction 6 and of the N+N junction at the edge of region 4 (as a result of the edge curvature of the N+N junction) peaks are formed in the field strength distribution.

In the case shown in FIG. 12B the peak value is highest at junction 6 and higher then the maximum value of $E_b$ at junction 5, so that breakdown will occur at that area at the surface but at comparatively higher values than in the case of FIG. 12A since the field strength distribution at the surface is more homogeneous and the maxima will thus decrease. The case of FIG. 12B may be obtained from that of FIG. 12A, for example, by reducing the thickness d of layer 1, with the doping remaining the same.

FIG. 12C shows the reverse case of FIG. 12B as regards surface field strength. In this case, the field strength peak at the edge of region 4 is much higher than at pn junction 6. This case may occur, for example, when layer 1 has a very high resistivity and region 1 is depleted before the breakdown occurs. In that case, breakdown may occur at the edge of region 4 when the maximum field strength at said edge is higher than that at pn junction 5.

More favorable is the case shown in FIG. 12D. In this case it is ensured that the doping concentration and the thickness of region 1 are such that the two field strength peaks at the surface are substantially equal. Although breakdown at the surface will still occur when, as shown in FIG. 12D, the maximum field strength $E_b$ at pn junction 5 is smaller than the maxima at the surface, the maximum field strength at the surface becomes lower in this case, by making the field strength distribution S at the surface to be symmetrical, than in an asymmetrical field strength distribution so that the breakdown occurs at a higher voltage.

FIG. 12E finally shows a case in which the maximum field strength at the surface at an arbitrary reverse voltage is lower than the maximum field strength at pn junction 5 by an efficacious choice of doping and thickness of layer 1 and by increasing the distance L with a given doping concentration of region 2. As a result of this, the breakdown in this case will always occur within the semiconductor body at pn junction 5 and not at the surface.

It is furthermore to be noted that at too small a value of said distance L the field strength at the surface will increase (as a matter of fact the overall voltage between regions 3 and 4 determines the area between the curve S and the line $E_s=0$), so that breakdown at the surface occurs at lower voltage.

Figure 13:
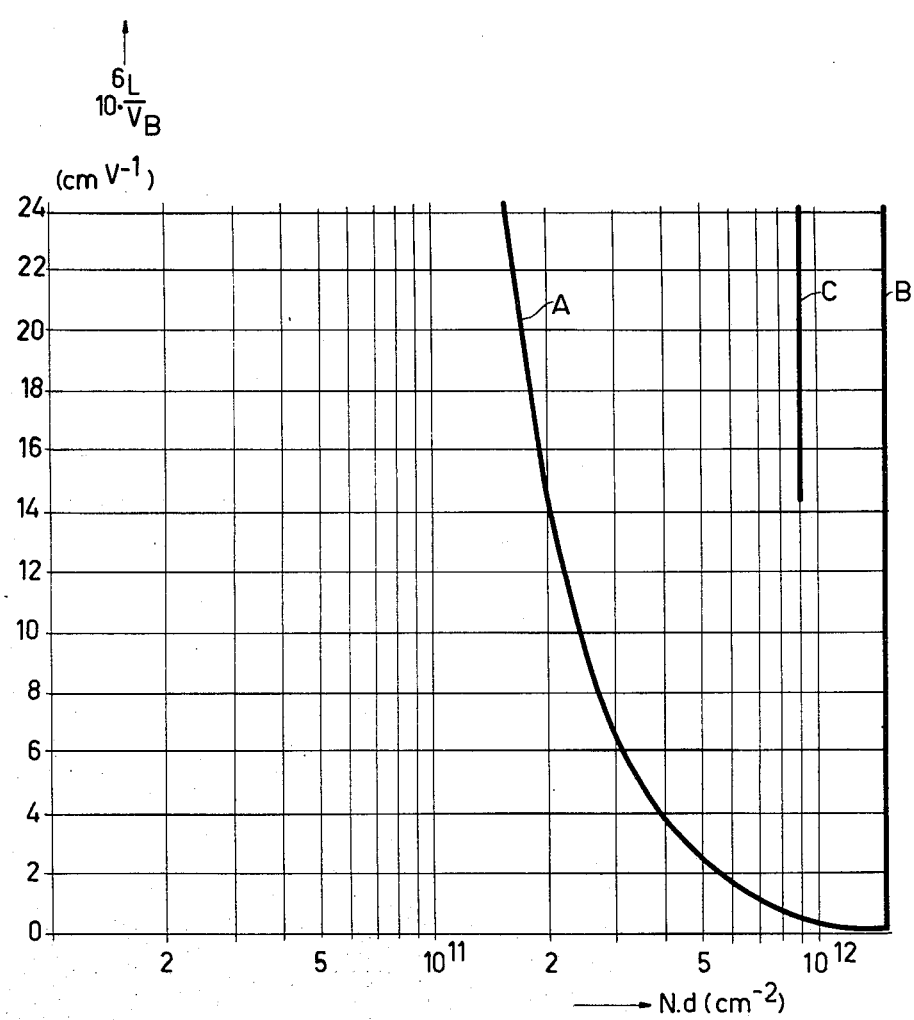
FIG. 13 shows for a preferred embodiment the relationship between the doping and dimensions of the island-shaped first region.

Calculations have proved that the most favorable values for the breakdown voltage are obtained within the area enclosed in FIG. 13 by the lines A and B. In FIG. 13 the product of the doping concentration N in atoms per $cm^3$ and the thickness d in cm of the region 1 is plotted on the horizontal axis for silicon as a semiconductor and the value of $10^6 \cdot (L/V_B)$ with L in cm and $V_B$ in volts is plotted on the vertical axis. $V_B$ is the unidimensionally computed value of the breakdown voltage of p-n junction 5, that is to say in FIGS. 12A to 12E the breakdown voltage of the $N^+N^-P^-$ structure when it is assumed that the doping concentrations of regions 1 and 2 are homogeneous, so p-n junction 5 is abrupt, that $N^+$ region 4 has a substantially negligible series resistance, and the $N+N^-P^-$ structure extends infinitely far in all directions perpendicular to the axis $E_s$. This fictitious breakdown voltage $V_B$ can very simply be computed with said assumptions. For that purpose see, for example, S. M. Sze, Physics of Semiconductor Devices, Wiley & Sons, New York 1969, chapter 5.

For this case in which silicon is chosen as a semiconductor material it appears that for values of $N \times d$ which lie between the lines A and B, that is to say for $$7.6 \cdot 10^8 \sqrt{\frac{V_B}{L}} \leq N \cdot d \leq 1.5 \cdot 10^{12}$$

the condition of FIG. 12D (symmetrical field distribution at the surface) is satisfied.

If the condition of FIG. 12E is also to be satisified (symmetrical field distribution at the surface, with breakdown at p-n junction 5) values for L, N and d should be chosen which lie on or near the line C of FIG. 13. For $(L/V_B) \geq 1.4 \cdot 10^{-5}$ it holds substantially that $N \cdot d = 9 \cdot 10^{11}$ $cm^{-2}$.

As already said, the values of FIG. 13 apply to silicon which has a critical field strength E of approximately $2.5 \cdot 10^5$ volts per cm and a dielectric constant $\epsilon$ of approximately 11.7. In general, for semiconductor materials having a relative dielectric constant $\epsilon$ and a critical field strength E it holds that between the lines A and B $$2.6 \cdot 10^2 \epsilon E \times \sqrt{\frac{V_B}{L}} \leq N \cdot d \leq 5.1 \cdot 10^5 \epsilon E$$

and for the line C: $N \cdot d$ substantially equal to $3 \cdot 10^5 \epsilon E$ and, in this case also, $(L/V_B) \geq 1.4 \cdot 10^{-5}$.

The values $\epsilon$ and E can be found from the available literature by those skilled in the art. For the critical field strength E reference may be made, for example, to S. M. Sze, Physics of Semiconductor Devices, Wiley & Sons, New York 1969, p. 117, FIG. 25.

By means of what has been described above with reference to FIGS. 8A to 8E and 9, those skilled in the art can select the dopings and dimensions which are most favorable in given circumstances for all the semiconductor structures described in the preceding and subsequent examples. It will not always be necessary or desirable that in all circumstances (FIG. 9, curve C) surface breakdown is avoided. It will even not always be necessary to operate within the lines A and B of FIG. 13 since outside said lines high surface breakdown voltages can also be achieved. However, the condition that the island-shaped region in vertical direction is fully depleted before surface breakdown occurs will always have to be satisfied.

Figure 14:
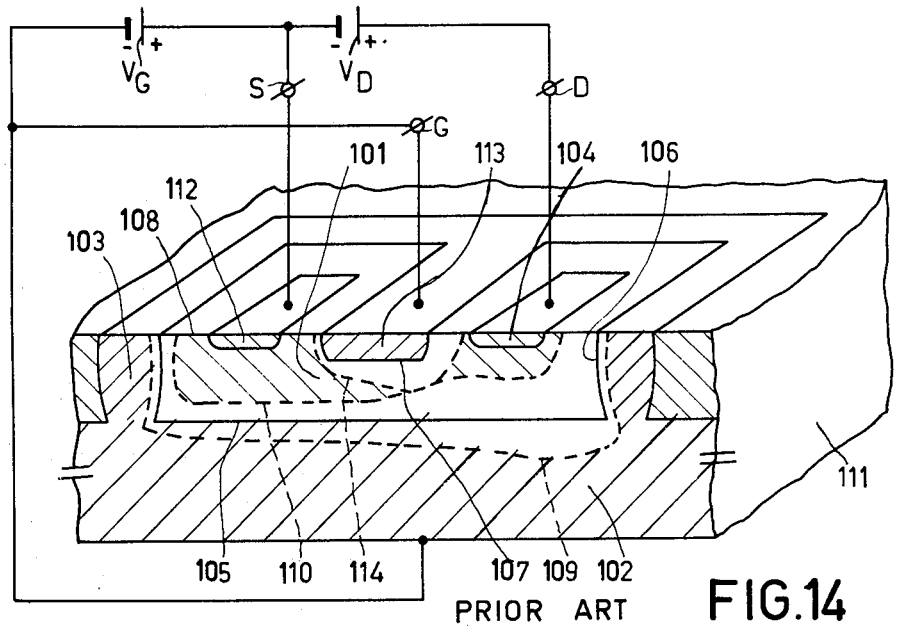
FIG. 14 shows diagrammatically a known semiconductor device with a field effect transistor, partly as a cross-sectional view and partly as a perspective view.

FIG. 14 shows a known semiconductor device partly as a cross-sectional view and partly as a perspective view. The device comprises a semiconductor body with a field effect transistor comprising a source electrode and drain electrode with associated electrode zones 112 and 104, an intermediately located channel region 101 and a gate electrode with associated electrode zone 113 adjoining the channel region 101. Said gate electrode serves to influence a depletion zone by means of a gate voltage applied to the gate electrode for controlling a flow of charge carriers, in this example an electron flow, between source electrode 112 and drain electrode 104. In this example the source electrode, the drain electrode and the gate electrode all consist of a semiconductor zone and a metal layer which is provided thereon and which makes an ohmic contact with the associated electrode zone and which is not shown in the Figure for reasons of clarity. Channel region 101 in this example is n-conductive, electrode zones 112 and 104 are n-conductive with a higher doping than region 101, and gate electrode zone 113 is p-conductive and forms a rectifying pn junction 107 with channel region 101.

As appears from FIG. 14, the field effect transistor comprises a layer-shaped first region 101 of a first conductivity type, in this case the n-conductivity type. First region 101 which in the present case also is the channel region adjoining the gate electrode constitutes, with an underlying p-type conductive second region 102, a first pn junction 105 extending substantially parallel to surface 108. An island-shaped portion of the region 101 is bounded laterally by a second pn junction 106 with associated depletion zone. Said second pn junction 106 is formed between first region 101 and a p-type conductive third region 103 which extends between second region 102 and surface 108 and which has a higher doping concentration than the second region 102. PN junction 106 thus has a lower breakdown voltage than first pn junction 105. The gate electrode adjoins the island-shaped portion of region 101.

As shown in FIG. 14, the gate electrode is connected to the substrate (in this case second region 102), although this is not necessary. Upon applying a voltage $V_D$ between the connection terminals S and D of the source and drain electrodes, electrons flow through the region 101 from zone 112 to zone 104. By applying a voltage in the reverse direction between gate electrode zone 113 and the region 101 and between second region 102 and region 101, depletion zones are formed, the boundaries (9, 10, 14) of which are shown in broken lines in FIG. 14. These depletion zones are shown without any shading.

In the above-described known devices, the doping concentration and the dimensions are such that at the breakdown voltage of pn junction 106 region 101 near drain electrode 104 is not depleted. The voltage in the reverse direction across pn junctions 106 and 107 which is highest near the drain electrode 104 gives rise to a field strength distribution at which the maximum value of the field strength occurs near the place where pn junctions 106 and 107 intersect the surface 108 and it is near said surface that breakdown ultimately occurs at a voltage which is considerably lower than the breakdown voltage of the pn junction 105 within the bulk of the semiconductor body.

Figure 15:
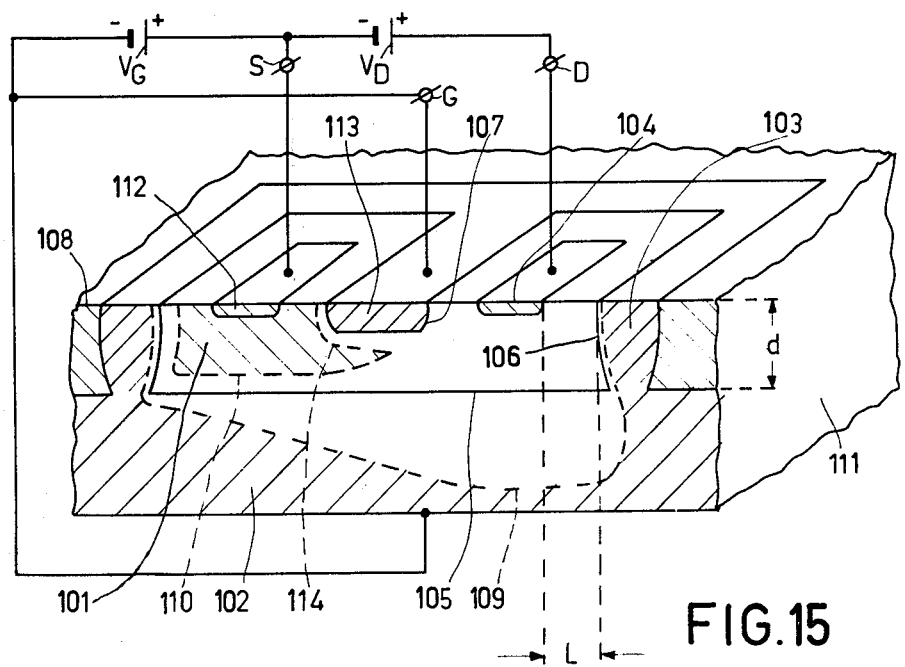
FIG. 15 shows diagrammatically a semiconductor device with a field effect transistor according to the invention, partly as a cross-sectional view and partly as a perspective view.

FIG. 15 shows a semiconductor device according to the invention. This device is similar to a considerable extent to the known device shown in FIG. 14. According to the invention, however, in the device shown in FIG. 15, the doping concentration and the thickness of first region 101 are so small that upon applying a voltage in the reverse direction between second region 102 and a contact region belonging to the source, drain and gate electrodes (in this example the drain electrode 104) and forming a non-rectifying contact with the island-shaped region the depletion zone, at least between the drain electrode 104 and second pn junction 106, extends from first pn junction 105 throughout the thickness of island-shaped region 101 at a voltage which is lower than the breakdown voltage of second pn junction 106. FIG. 15 shows the condition in which region 101 between zones 107 and 104 is fully depleted up to pn junction 106. The voltage across pn junctions 105, 106 and 107 are taken up entirely by the coherent depletion zone extending from drain zone 104 up to boundary 109. As a result of this, the field strength at the surface is reduced considerably. The breakdown voltage is consequently determined to at least a considerable extent by the properties of pn junction 105 extending within the bulk of the semiconductor body. This breakdown voltage may be very high and may closely approach the breakdown voltage to be expected theoretically on the basis of the doping of regions 101 and 102.

In order to achieve the described result endeavored by the invention the following dopings and dimensions are used in the device shown in FIG. 15 which has a semiconductor body of silicon:

Zones 104 and 112: thickness 1 $\mu$m

Region 101: n-type, doping concentration $1.5 \cdot 10^{15}$ atoms/cm$^3$, thickness 5 $\mu$m Region 102: p-type, doping concentration $1.7 \cdot 10^{14}$ atoms/cm$^3$, thickness 250 $\mu$m Zone 113: p-type, thickness 2.5 $\mu$m distance L from the drain electrode 104 up to the p-n junction 106: b 50 $\mu$m In this case the unidimensionally computed breakdown voltage $V_B$ of the first pn junction was 1270 volts. The actual breakdown voltage proved to be 700 volts. At the given thicknesses and doping concentrations, the depletion zone in region 102 extends over a thickness which is smaller than the thickness of region 102, while it is also avoided that the depletion zone of pn junction 106 reaches zone 104 at a voltage value which is smaller than the breakdown voltage of pn junction 106 taken in itself (in the absence of pn junction 105).

Using the said values for N, d, L and $V_B$, in this example for silicon ($\epsilon = 11.7$; $E = 2.5 \cdot 10^5$ volt/cm) the condition $$2.6 \cdot 10^2 \, \epsilon \, E \sqrt{\frac{V_B}{L}} \leq N \cdot d \leq 5.1 \cdot 10^5 \, \epsilon \, E$$

is satisfied.

In the semiconductor device shown in FIG. 15, first region 101 is formed by an epitaxial layer provided on second region 102. In this example the island-shaped portion of the first region is laterally entirely bounded by second pn junction 106. Although other configurations are possible, as will be seen later on, this technologically is the simplest configuration. The island-shaped region portion may, for example, be bounded over a part of its circumference in a different manner, for example by a sunken oxide pattern or by a groove filled with passivating glass.

In the devices shown in FIGS. 14 and 15 the gate electrode forms a rectifying contact and the source and drain electrodes form non-rectifying contacts with the region 101 by means of doped surface zones 112, 104 and 113. However, the presence of said surface zones is not strictly necessary. Instead of semiconductor zones 112 and 104 ohmic metal-to-semiconductor contacts may be provided and instead of zone 113 a recifying metal-to-semiconductor contact (Schottky contact) may be provided on region 101. Instead of a gate electrode with rectifying junction, a conductive layer separated from semiconductor surface 108 by an insulating layer may also be used with which a depletion zone is formed in epitaxial layer 101, for example, as is the case in a deep depletion transistor.

Figure 16:
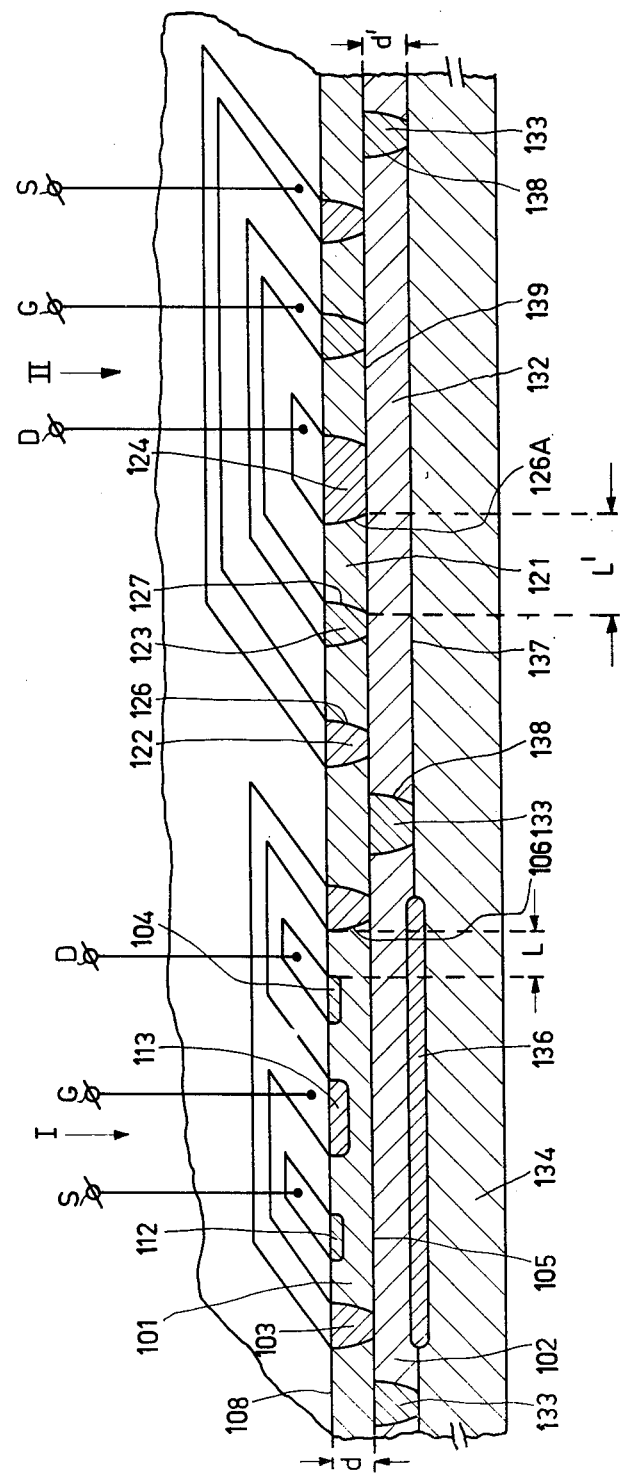
FIG. 16 shows another embodiment of the semiconductor device with a field effect transistor according to the invention.

FIG. 16 shows how the invention may be used to provide in the same monolithic integrated circuit juxtaposed p-channel and n-channel junction field effect transistors (JFET).

A p-channel field effect transistor which in principle is equal to the field effect transistor described with reference to FIG. 15 but in which the conductivity types of all corresponding semiconductor zones are opposite to those of FIG. 15 is provided at I. Furthermore, second region 102 of said transistor is formed by an n-type epitaxial layer which is provided on a p-type substrate 134. A highly doped n-type buried layer 136 is situated between epitaxial layer 102 and substrate 134 to prevent penetration of the depletion zone associated with pn junction 105 down to the substrate 134.

A second junction field effect transistor II is provided beside the field effect transistor I. This, too, is a field effect transistor according to the invention. This second transistor II also comprises an island-shaped region portion 132 which is formed by a portion of the same epitaxial layer from which the region 102 of transistor I is formed. N-type source zone 122, n-type drain zone 124 and p-type gate electrode zone 123 extend throughout the thickness of p-type semiconductor layer 121 present on island 132 and from which region 101 of transistor I has also been formed down to n-type region 132. Source and drain zones 122 and 124 form pn junctions 126 and 126A with region 121, and regions 121 and 132 form pn junction 139. In this second field effect transistor the channel region is formed by region 132. For the mutual insulation of the transistors I and II highly doped p-type zone 133 is provided which surrounds both region 102 and region 132 entirely and forms with region 132 pn junction 138.

Upon applying a suitable voltage between source zone 122 and drain zone 124, electrons move from the source zone to the drain zone through region 132. This flow of electrons can be influenced by applying a gate voltage in the reverse direction between zone 123 and region 132 (and possibly also by the reverse voltage between regions 132 and 134). As in the example of FIG. 15, the doping concentration and the thickness of layer 102, 132 have been chosen to be such that long before the occurrence of breakdown, region 101 is fully depleted at least between drain zone 104 and pn junction 106 and region 132 is fully depleted at least between drain zone 124 and pn junction 127. As a result of this the field strength at surface 108, and in transistor II that at surface 139 between regions 121 and 132, is strongly reduced and the breakdown voltage considerably increased. In this example also the distance from drain electrode 124 up to pn junction 127, taken along the surface, is chosen to be larger than the lateral distance over which the depletion zone starting from said pn junction 127 would extend in the lateral direction at the breakdown voltage of said pn junction. This to prevent the breakdown from occurring prematurely as a result of the bridging of the distance from zone 124 to zone 123 by the depletion zone of pn junction 127.

In FIG. 16, as in FIG. 15, the insulating (oxide) layers and contact layers present at the surface are not shown. The source, drain and gate electrode connections are denoted diagrammatically by S, D and G.

Figure 17:
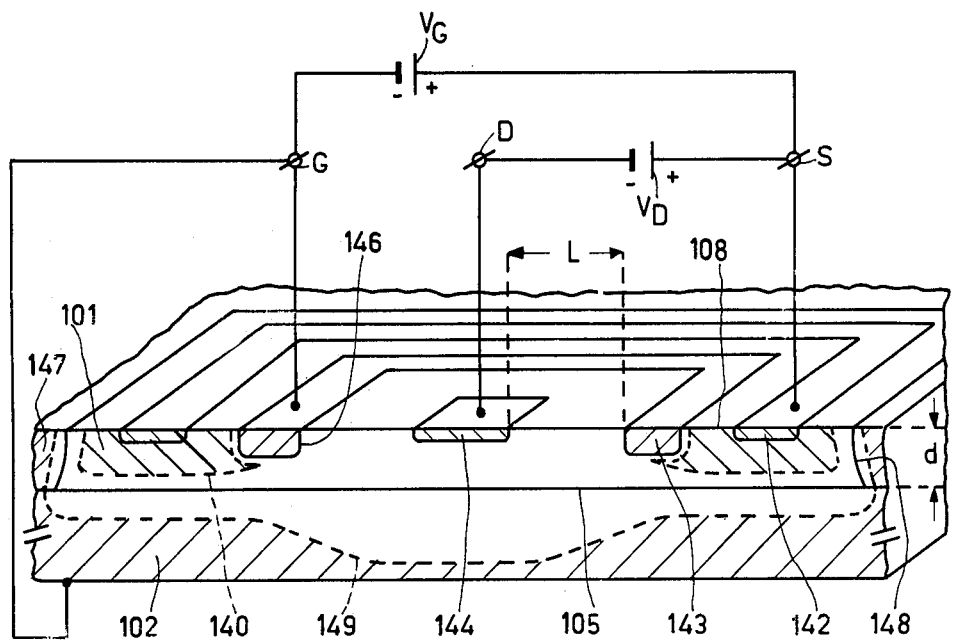
FIGS. 17 and 18 show further embodiments of the semiconductor device with a field effect transistor according to the invention.

FIG. 17 shows a further modified embodiment of the semiconductor device including a field effect transistor according to the invention. As in the second field effect transistor II of FIG. 16, n-type drain zone 144 is surrounded by p-type gate electrode zone 143 and this in turn by n-type source zone 142. All electrode zones are provided within first region 101 which constitutes, with an underlying second, p-type region 102, a first pn junction 105 and, with a highly doped p-type region 147, a pn junction 148 terminating at surface 108. Source, drain and gate electrode zones 142, 144 and 143 extend only over a part of the thickness of first region 101. The field effect transistor can be operated in the same manner as the preceding transistors. Boundaries 149 and 140 of the depletion zone which are shown in the Figure have been drawn for a reverse voltage between regions 101 and 102 which is lower than the breakdown voltage. Region 101 is fully depleted between gate electrode zone 143 and drain zone 144. As in the field effect transistor II of FIG. 16, the island-shaped portion of the first region is surrounded by the gate electrode which in this case fulfils the function of the third region. PN junction 146 between the gate electrode zone and region 101 forms the second pn junction. Since the doping and the thickness of first region 101 have been chosen to be so that the said region is fully depleted with increasing gate-drain voltage before breakdown of pn junction 106 occurs, the field effect transistor can be used at very high voltage between the control electrode and the drain electrode.

Figure 18:
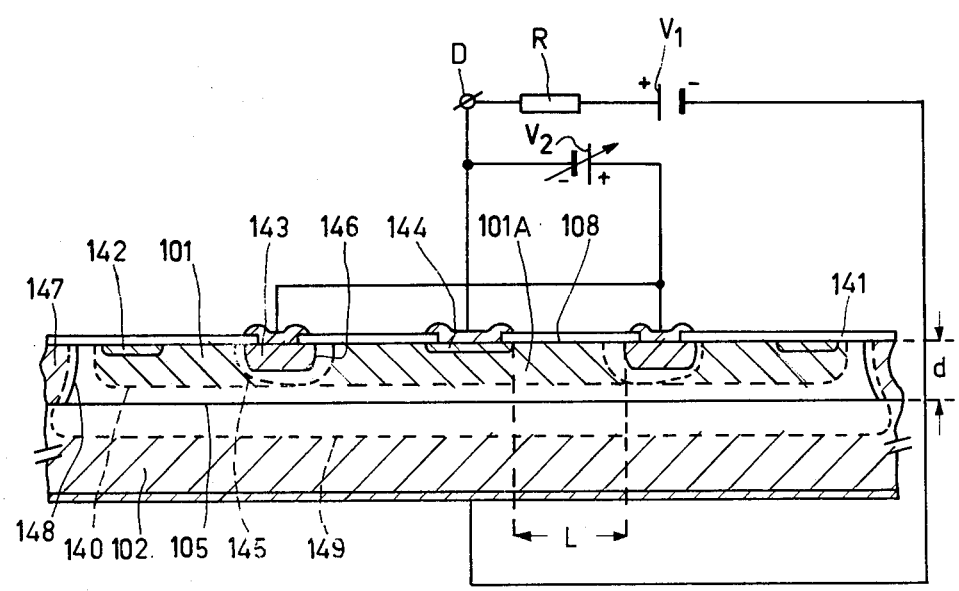

Moreover, the device shown in FIG. 17 is very interesting because, with a small variation, it may be used as a switching diode for high voltages. Such a switching diode is shown in FIG. 18. The semiconductor structure of this device may equal that of FIG. 17 with the only difference that in this case zone 142 need not be contacted, hence may be covered everywhere by an insulating layer 141, and that it is ensured that the breakdown voltage between regions 147 and 142 is low. In order to achieve this, region 142 is provided at a small distance from region 147, possibly even against region 147, or penetrating into region 147.

A voltage $V_1$ in the reverse direction is applied across pn junction 105 via ohmic contacts on zones 144 and 102. An impedance, in this example a resistor R, is connected in series with the voltage source $V_1$. A variable voltage $V_2$ in the reverse direcion is applied across pn junction 146.

FIG. 18 shows the condition in which the voltage $V_1$ is still small and in which such a high voltage $V_2$ is applied to the gate electrode that the associated depletion zone (boundary 145) has reached depletion zone boundary 140 of pn junction 105. In these circumstances an island-shaped portion 101A is surrounded by the depletion zones and cut off electrically from the remaining part of first region 101.

The voltage $V_1$ may now be increased to very high values since the island-shaped region portion 101A is fully depleted from pn junction 105 up to the surface 108 already at a comparatively low voltage $V_1$ and, when the voltage $V_1$ is further increased, the breakdown voltage is no longer determined by the comparatively low breakdown voltage of pn junction 146 but by that of flat pn junction 105 not emerging at the surface. Hence in this case also, gate electrode zone 143, and not region 147, fulfils the function of the above-mentioned third region.

The high voltage $V_1$ now is substantially entirely across the depletion zone between surface 108 and boundary 149, and the depletion zone extends approximately as is shown in FIG. 17. There is substantially no voltage drop across the impedance R since only a small leakage current flows through it and said impedance R is chosen to be much smaller than that of the blocked semiconductor device connected in series therewith.

When the control volate $V_2$ is reduced to such an extent that the depletion zone no longer cuts off region 101 between the gate electrode zone 143 and pn junction 105, then a drift field is formed as a result of which source zone 142 tends to reach the potential of drain zone 144. Long before this can happen, however, breakdown occurs between regions 147 and 142 so that the voltage across the semiconductor device disappears substantially entirely and the voltage $V_1$ comes substantially entirely across the impedance R.

In this manner, the voltage across the impedance R can be switched between a low and a high value by means of the control voltage $V_2$.

Figure 19:
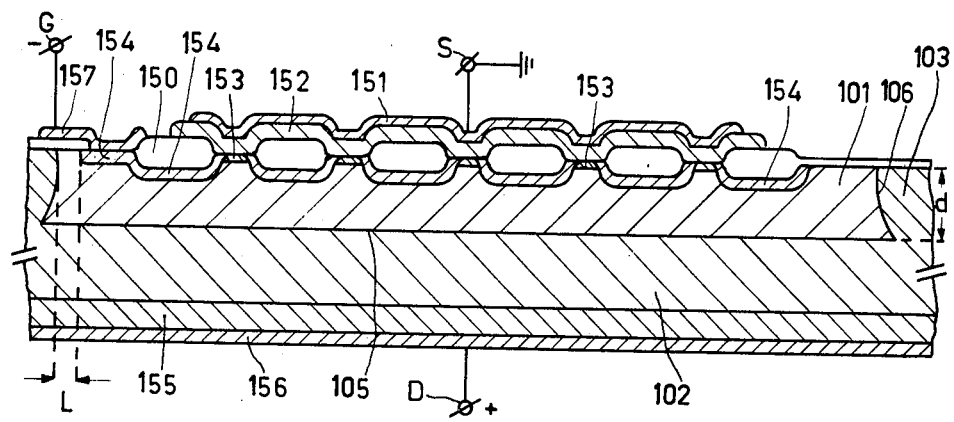
FIG. 19 shows a semiconductor device with a vertical field effect transistor according to the invention.

FIG. 19 is a diagrammatic cross-sectional view of a vertical field effect transistor according to the invention. It consists of an island-shaped region 101 which in this example is p-conductive. In this case region 101 is a part of a p-type epitaxial layer having a thickness of 4 $\mu$m and a doping concentration of $1.3 \cdot 10^{15}$ atoms/cm$^3$ which is grown on an n-type substrate 102 having a thickness of 250 $\mu$m and a doping concentration of $3.2 \cdot 10^{14}$ atoms/cm$^3$. Island-shaped region 101 is bounded laterally by an n-type diffused zone 103. Within island 101 a pattern of silicon oxide 50 counter-sunk partly in the semiconductor material is provided by selective thermal oxidation in the form of an oxide layer in which apertures are present surrounded entirely by the oxide. Within the semiconductor material the oxide 50 is bounded by a thin, highly doped p-type zone 154 which is contacted outside insulating pattern 150 and forms the gate electrode zone. The shortest distance between zone 154 and pn junction 105 is 2, 5 $\mu$m.

Furthermore, a highly doped n-type layer 152 of polycrystalline silicon is provided on the surface and contacts, between counter-sunk oxide parts 150, the semiconductor surface at surface zones 153 obtained by diffusion from layer 152. A metal layer 151 is provided on layer 152, while region 102 is contacted by means of a highly doped semiconductor contact layer 155 and a metal layer 156. The connections of the source, drain and gate electrodes are denoted diagrammatically by S, D and G.

In the operating condition a voltage which is positive with respect to the source electrode S is applied to the drain electrode D. A voltage which is at least so negative with respect to the drain electrode that the depletion zone extends from pn junction 105 between regions 101 and 102 up to the surface is present at the gate electrode, so that region 101 is fully depleted. The flow of electrons which move from the source electrode to the drain electrode is substantially not impeded by depleted region 101. By varying the voltage at the gate electrode, the potential distribution within depleted region 101 may be varied and, for example, a potential threshold may be formed so that the flow of electrons from the source electrode to the drain electrode via the depleted region 101 can be controlled. Since the region 101 is fully depleted at a voltage lower than the breakdown voltage of pn junction 106, a vertical field effect transistor for very high voltage can be obtained since as a result of the above-described principle the voltage at which breakdown occurs between the regions 101 and 102 may be very high.

The semiconductor device shown in FIG. 19 may be manufactured as follows. The starting material is an n-type substrate 102 having a p-type epitaxial layer with the above-mentioned dopings and thickness. Island insulation zone 103 is formed by conventional diffusion methods, for example by phosphorus diffusion. Simultaneously, highly doped n-type contact layer 155 is diffused on the lower side.

An anti-oxidation mask, at the same time an implantation mask, which contains silicon nitride and which will hereinafter be referred to as nitride mask, is then provided in the form of a quadratic frame consisting of masking strips, 4 $\mu$m wide, which are situated at 10 $\mu$m distance from each other. Boron is then implanted in a dose of $10^{15}$ ions per cm$^2$ with an energy of 60 KeV. Th photolacquer which is used for etching the mask remains and also serves as a mask against the implantation. In this manner p-type layer 154 is formed.

The photolacquer is then removed and after annealing at 90° for 30 minutes the oxide pattern is provided by thermal oxidation in a thickness of, for example, 1 $\mu$m. The technologies to form a counter-sunk oxide pattern by selective oxidation are elaborately described in Philips Research Reports, Vol. 25, 1970, pp. 118–132. After removing the nitride mask a layer 152 of polycrystalline silicon, 0.5 $\mu$m thick, is provided which is doped n-type, for example, by phosphorus implantation. Heating at 1050° C. for 30 minutes in nitrogen is then carried out, channel regions 153 being formed by diffusion from layer 152. The aluminium metallization (151, 156, 157) is then provided by vapor deposition and masking, and the device may be assembled in an envelope.

The distance L (see FIG. 19) in this example is 70 $\mu$m. The unidimensionally computed breakdown voltage $V_B$ of the P+P−N− structure (154, 101,102) is approximately 688 volts. With (for silicon) $\epsilon = 11.7$ and $E = 2-.5 \cdot 10^5$ volt/cm the condition $$2.6 \cdot 10^2 \epsilon E \sqrt{\frac{V_B}{L}} \leq N \cdot d \leq 5.1 \cdot 10^5 \epsilon E$$

is satisfied.

When region 153 is low-doped, control of the current between source and drain electrode may also occur in that the pn junction between regions 154 and 153 forms a depletion zone in region 153 which, by variation in the gate voltage, varies the cross-section of the current path through region 153. In certain circumstances both this and the above-mentioned mechanism may play a part.

Figure 20:
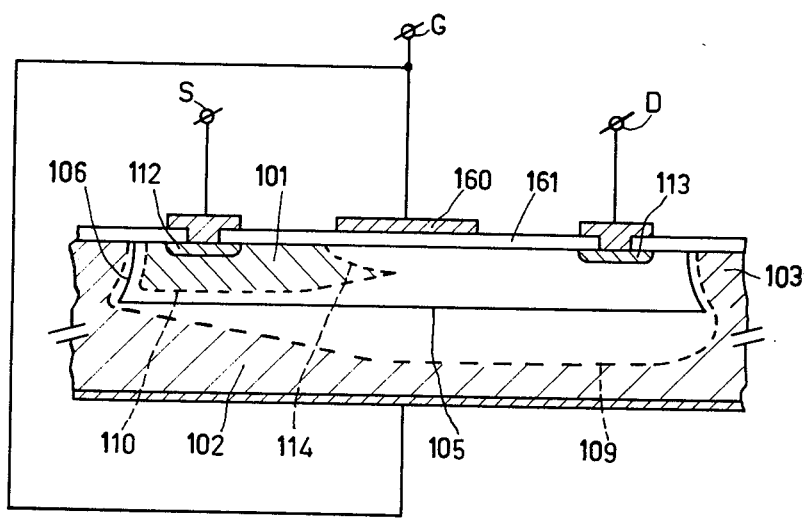
FIG. 20 shows a deep depletion field effect transistor according to the invention.

The invention is not restricted to field effect transistors having a pn junction or a Schottky junction. For example, the gate electrode may be separated from the semiconductor surface by an insulating layer. FIG. 20 shows as an example a diagrammatic cross-sectional view of a deep depletion transistor which is entirely equal in structure and operation to the transistor shown in FIG. 15 with the only difference that the depletion zone of the gate electrode (boundary 114) is not formed by a pn junction but by a gate electrode.

The considerations given with reference to FIGS. 1 through 11 in the discussion of FIGS. 12A to 12E and 13 may also be applied to the semiconductor device disclosed in FIGS. 14 through 20. In FIGS. 14 through 20 of this application, regions with reference numerals 101, 102, 103 and 104 correspond in all respects with regions having reference numerals 1, 2, 3 and 4 in FIGS. 12A and 12E of the present application and the dopings and dimensions may with equal advantage be selected in the manner described above with reference to FIGS. 12A to 12E and 13.

It should be stressed that although in the given examples the third region (3, 103) is always higher doped than the second region (2, 102), said third region may also have the same doping concentrations as the second region, thus forming an extension of the second region. In such cases the lower breakdown voltage of the second pn junction 6, 106 is caused by the strong curvature in the transition region between the first and second pn junctions 5, 105 and 6, 106.

The invention is not restricted to the embodiments described. Within the scope of the invention numerous variations are possible to those skilled in the art. For example, all conductivity types may be simultaneously replaced by their opposite types while reversing the polarity of the applied voltages. Instead of silicon, any other semiconductor material may be used, for example, germanium or an $A_{III}$-$B_V$ compound, for example GaAs, or a combination of several semiconductor materials forming so-called hetero-junctions between them. For insulating layers 16, 116 and the metal contact layers any useful material may be used.

Moreover, the semiconductor circuit element should not necessarily be a transistor. For instance, when in FIG. 1 emitter zone 7 is omitted, a high-voltage diode according to the invention with electrodes 14 and 13 is obtained.

What is claimed is:

1. A semiconductor device having a semiconductor body having at least one bipolar high voltage semiconductor circuit element, said bipolar circuit element comprising:

substantially flat first and second opposed surfaces on said semiconductor body;

an island-shaped first region of a first conductivity type adjoining said first substantially flat surface;

a second region of a second conductivity type underlying said first region;

said first region forming with said underlying second region of the second conductivity type a first pn-junction extending substantially parallel to said first surface;

a third region of said second conductivity type extending betwen said second region and said first surface;

said first region being laterally bounded at least partly by a second pn-junction with an associated depletion zone which is formed between said first region and said third region;

said second pn-junction having a lower breakdown voltage than said first pn-junction;

a contact region adjoining said first surface and said first region;

said contact region being bounded entirely by said first region;

the doping concentration and the thickness of said first region being so small that upon applying a voltage in the reverse direction between said first and said second regions, the depletion zone, at least between said contact region and said third region extends from said first pn-junction up to said first surface at a voltage between said first and second regions which is lower than the breakdown voltage of said second pn-junction.

2. A semiconductor device as claimed in claim 1, wherein the distance L from said contact region to said second pn-junction, taken along said first surface, is greater than the distance over which said depletion zone associated with said second pn-junction extends along said first surface at the breakdown voltage of said second pn-junction.

3. A semiconductor device as claimed in claim 2, wherein said doping concentration N in atoms/cm³ and the thickness d in cm of the island-shaped first region satisfy the condition $$2.6 \cdot 10^2 \, \epsilon \, E \cdot \sqrt{\frac{V_B}{L}} \leq Nd \leq 5.1 \cdot 10^5 \, \epsilon \, E,$$

wherein $\epsilon$ is the relative dielectric constant and E the critical field strength in volt/cm which avalanche multiplication occurs in said semiconductor material of said first region, L is the distance in cm from said contact region up to said second pn junction, and $V_B$ is the unidimensionally computed value of the breakdown voltage of the first pn junction in volts.

4. A semiconductor device as claimed in claim 3, wherein N.d is substantially equal to
    $3.0 \cdot 10^5 \epsilon E$, and $L \geq 1.4 \cdot 10^{-5} \cdot V_B$.

5. A semiconductor device as claimed in claim 1 wherein said doping concentration of at least the portion of said second region adjacent said first region is lower than that of said first region.

6. A semiconductor device as claimed in claim 1 wherein said second region has such a thickness that at the breakdown voltage of said first pn junction the depletion zone extends in said second region over a distance smaller than the thickness of said region.

7. A semiconductor device as claimed in claim 1 wherein said first region is formed by an epitaxial layer of said first conductivity type provided on said second region.

8. A semiconductor device as claimed in claim 1 wherein said first region is bounded laterally entirely by said second pn junction.

9. A semiconductor device as claimed in claim 1 wherein said island-shaped first region forms one of the collector and base zones of said bipolar high-voltage transistor and said contact region is a fourth semiconductor region of said first conductivity type having a higher doping concentration than said first region and being surrounded entirely by said first region.

10. A semiconductor device as claimed in claim 9 wherein:

a surface-adjoining emitter zone of said second conductivity type fully surrounded by said fourth region is provided in said fourth region;

said first region and said fourth region together constituting the base zone; and said second region constituting the collector zone of said transistor.

11. A semiconductor device as claimed in claim 10, wherein:

said first region forms part of a first epitaxial layer of said first conductivity type and is separated from the remaining part of said first epitaxial layer by said third region;

said second region is an island-shaped part of second epitaxial layer of said second conductivity type which is provided on a substrate of said first conductivity type;

said island-shaped part being separated from the remaining part of said second epitaxial later by an isolation zone of said first conductivity type not adjoining said first and third regions and extending from said first epitaxial layer down to said substrate.

12. A semiconductor device as claimed in claim 10, wherein:

said second region adjoins an underlying further region of said first conductivity type;

said further region together with said second region, said first region, said fourth region, and said zone of said second conductivity type provided therein forms a thyristor.

13. A semiconductor device as claimed in claim 12, wherein said further region is connected to said first surface by a highly doped zone of said first conductivity type not adjoining said first and said third regions.

14. A semiconductor device as claimed in claim 12, wherein said second region is a semiconductor layer of said second conductivity type on which a combination of said first, third and fourth regions is provided on both sides, a surface zone of said second conductivity type being embedded on at least one side in said fourth region.

15. A semiconductor device as claimed in claim 9, wherein a base zone of said second conductivity type and therein an emitter zone of said first conductivity type are provided in said first region, said first and said fourth regions constituting together the collector zone of said transistor.

16. A semiconductor device as claimed in claim 15, wherein said base zone adjoins and merges into said third region.

17. A semiconductor device with a semiconductor body having a substantially flat surface, including at least one field effect transistor having a source electrode and a drain electrode, a channel region between said source and drain electrodes, and a gate electrode adjoining said channel region to influence, by means of a gate voltage applied to the gate electrode, a depletion zone for controlling a flow of charge carriers between the source and drain electrodes, said field effect transistor comprising:
 a layer-shaped first region of a first conductivity type;
 an underlying second region of a second conductivity type;
 said first region and said second region forming a first pn junction extending substantially parallel to said surface;
 a third region of said conductivity type adjoining said first region;
 an island-shaped portion of said first region being bounded at least in the operating condition laterally at least partly by a second pn junction with an associated depletion zone formed between said first region and said third region of the second conductivity type adjoining said first region;
 said second pn junction having a lower breakdown voltage than said first pn junction, at least the gate electrode adjoining the island-shaped region portion;
 the doping concentration and the thickness of said first region being so small that in the presence of a voltage in the reverse direction between said second region and a contact region of said field effect transistor belonging to the source, drain and gate electrodes and forming a non-rectifying contact with said island-shaped region portion, the depletion zone, at least between said contact region and said second pn junction, extends from said first pn junction throughout the thickness of said island-shaped region portion at a voltage which is lower than the breakdown voltage of said second pn junction.

18. A semiconductor device as claimed in claim 17, wherein the distance L from the said contact region to said second pn junction, taken along the surface, is greater than the distance over which the depletion zone associated with said second pn junction extends along the surface at the breakdown voltage of said second pn junction.

19. A semiconductor device as claimed in claim 18, wherein said doping cncentration N in atoms/cm$^3$ and the thickness d in cm of said island-shaped region portion satisfy the condition $$2.6 \cdot 10^2 \, \epsilon \, E \sqrt{\frac{V_B}{L}} \leq Nd \leq 5.1 \cdot 10^5 \, \epsilon \, E,$$

where $\epsilon$ is the relative dielectric constant and E the critical field strength in volt/cm at which avalanche multiplication occurs in said semiconductor material of said first region, L is the distance in cm from said contact region up to said second pn junction, and $V_B$ is the unidimensionally computed value of the breakdown voltage of said first pn junction in Volts.

20. A semiconductor device as claimed in claim 19, wherein N.d is substantially equal to $3.0 \cdot 10^5 \epsilon E$, and $L \geq 1.4 \cdot 10^{-5} \cdot V_B$.

21. A semiconductor device as claimed in claim 17 wherein said doping concentration of at least the portion of said second region adjacent said first region is lower than that of said first region.

22. A semiconductor device as claimed in claim 17 wherein said second region has a thickness such that at the breakdown voltage of said first pn junction the depletion zone extends in said second region over a distance less than the thickness of said region.

23. A semiconductor device as claimed in claim 17 wherein said first region is formed by an epitaxial layer of said first conductivity type provided on said second region.

24. A semiconductor device as claimed in claim 17 wherein said island-shaped part of said first region is bounded laterally entirely by said second pn junction.

25. A semiconductor device as claimed in claim 17 wherein said gate electrode comprises a semiconductor gate electrode zone which forms a pn junction wth the adjoining part of said channel region.

26. A semiconductor device as claimed in claim 17 wherein said gate electrode comprises a metal layer which forms a rectifying metal-to-semiconductor junction (Schottky junction) with the adjoining part of said channel region.

27. A semiconductor device as claimed in claim 17 wherein said gate electrode comprises a conductive layer which is separated from the adjoining part of said channel region by an insulating layer.

28. A semiconductor device as claimed in claim 17 wherein said field effect transistor is of the lateral type, the source and drain electrodes on either side of said gate electrode forming non-rectifying contacts with said first region, said contact region being formed by the drain electrode.

29. A semiconductor device as claimed in claim 17 wherein said gate electrode is connected to said second region.

30. A semiconductor device as claimed in claim 28 wherein said drain electrode is surrounded substantially entirely by said gate electrode and that said gate electrode is surrounded substantially entirely by the source electrode.

31. A semiconductor device as claimed in claim 29, wherein:
 a semiconductor layer of said second conductivity type is present on said first region;

the source and drain electrodes comprise electrode zones of said first conductivity type;

the gate electrode comprises an electrode zone of the second conductivity type; and all said electrode zones extend throughout the thickness of said semiconductor layer down to said first region.

32. A semiconductor device as claimed in claim 29, wherein:

said source electrode comprises a source zone of said first conductivity type which is not connected to an external voltage;

a highly doped zone of said second conductivity type is present on the side of said source zone remote from the gate electrode and extends from said surface down to said second region and is situated so close to said source that the breakdown voltage between these two zones is considerably lower than that of said first pn junction;

the drain electrode and said second region are connected to a voltage source which is connected in series with a load impedance and provides a reverse voltage across said first pn junction; and said gate electrode is connected to a voltage source which provides a variable reverse voltage between said gate electrode and said first region so that said island-shaped portion of said first region surrounded by said gate electrode and the associated depletion zone can be temporarily cut off electrically from the remaining part of said first region.

33. A semiconductor device as claimed in claim 17 wherein said field effect transistor is of the vertical type;

the drain electrode forms a non-rectifying contact with said second region;

the source electrode forms a rectifying contact with said first region; and said gate electrode comprises an electrode zone of said first conductivity type which surrounds at least one part of said first region associated with said channel region and forms said contact region.

* * * * *